(12) United States Patent
Ogawa

(10) Patent No.: US 11,227,876 B2
(45) Date of Patent: Jan. 18, 2022

(54) SUBSTRATE AND ELECTROPHORETIC DEVICE

(71) Applicant: Japan Display Inc., Minato-ku (JP)

(72) Inventor: Akihiro Ogawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 457 days.

(21) Appl. No.: 16/165,395

(22) Filed: Oct. 19, 2018

(65) Prior Publication Data
US 2019/0129269 A1    May 2, 2019

(51) Int. Cl.
*H01L 27/12*      (2006.01)
*G02F 1/167*      (2019.01)
(Continued)

(52) U.S. Cl.
CPC .......... *H01L 27/124* (2013.01); *G02F 1/1368* (2013.01); *G02F 1/13439* (2013.01); *G02F 1/13624* (2013.01); *G02F 1/133553* (2013.01); *G02F 1/136227* (2013.01); *G02F 1/136286* (2013.01); *G02F 1/167* (2013.01); *G02F 1/1677* (2019.01); *G02F 1/16766* (2019.01); *G02F 1/136245* (2021.01); *G02F 1/1676* (2019.01);
(Continued)

(58) Field of Classification Search
CPC ............ H01L 27/124; H01L 29/78609; H01L 29/78633; G02F 1/6766; G02F 1/133553; G02F 1/13439; G02F 1/136227; G02F 1/13624; G02F 1/136286; G02F 1/1368; G02F 1/167; G02F 1/1676; G02F 1/1677; G02F 1/136245; G02F 2001/1678; G02F 2201/121

USPC ......................................................... 349/113
See application file for complete search history.

(56) References Cited

U.S. PATENT DOCUMENTS 9,885,932 B2 *  2/2018  Hirose .............. G02F 1/134309
2005/0285108 A1 * 12/2005  Choi .................. H01L 29/78696
                                                                           257/59

(Continued)

FOREIGN PATENT DOCUMENTS

CN           101101422 A     1/2008
JP           2000-275660 A    10/2000

(Continued)

OTHER PUBLICATIONS

Chinese Office Action dated Jul. 19, 2021 in the corresponding Chinese patent application No. 2018112339063.7 (with English translation).
Japanese Office Action dated Aug. 3. 2021 in the corresponding Japanese patent application No. 2017-212036, (with English translation).

*Primary Examiner* — Charles S Chang
(74) *Attorney, Agent, or Firm* — Oblon, McClelland, Maier & Neustadt, L.L.P.

(57) ABSTRACT

A substrate includes a base material having an insulating property, a pixel electrode provided on one surface side of the base material, a pixel transistor provided between the base material and the pixel electrode, a first reflective film provided between the pixel transistor and the pixel electrode, and a common electrode provided between the pixel transistor and the first reflective film. The first reflective film has a first through-hole, the common electrode has a second through-hole, and a drain of the pixel transistor is coupled to the pixel electrode through the first through-hole and the second through-hole.

12 Claims, 25 Drawing Sheets

(51) Int. Cl.
*G02F 1/1362* (2006.01)
*G02F 1/1368* (2006.01)
*G02F 1/1343* (2006.01)
*G02F 1/1335* (2006.01)
*G02F 1/1677* (2019.01)
*G02F 1/16766* (2019.01)
*H01L 29/786* (2006.01)
*G02F 1/1675* (2019.01)
*G02F 1/1676* (2019.01)

(52) U.S. Cl.
CPC ............... *G02F 2001/1678* (2013.01); *G02F 2201/121* (2013.01); *H01L 29/78609* (2013.01); *H01L 29/78633* (2013.01)

(56) References Cited

U.S. PATENT DOCUMENTS

| | | | | |
|---|---|---|---|---|
| 2008/0007679 | A1* | 1/2008 | Ochiai | G02F 1/136227 349/114 |
| 2018/0120658 | A1* | 5/2018 | Kanaya | G02F 1/13624 |

FOREIGN PATENT DOCUMENTS

| | | |
|---|---|---|
| JP | 2006-235437 A | 9/2006 |
| JP | 2008-015345 A | 1/2009 |
| JP | 2009-075179 A | 4/2009 |
| JP | 2010-239108 | 10/2010 |
| JP | 2011-039478 A | 2/2011 |
| JP | 2011-221125 | 11/2011 |
| JP | 2016-224935 A | 12/2016 |

* cited by examiner

FIG.4
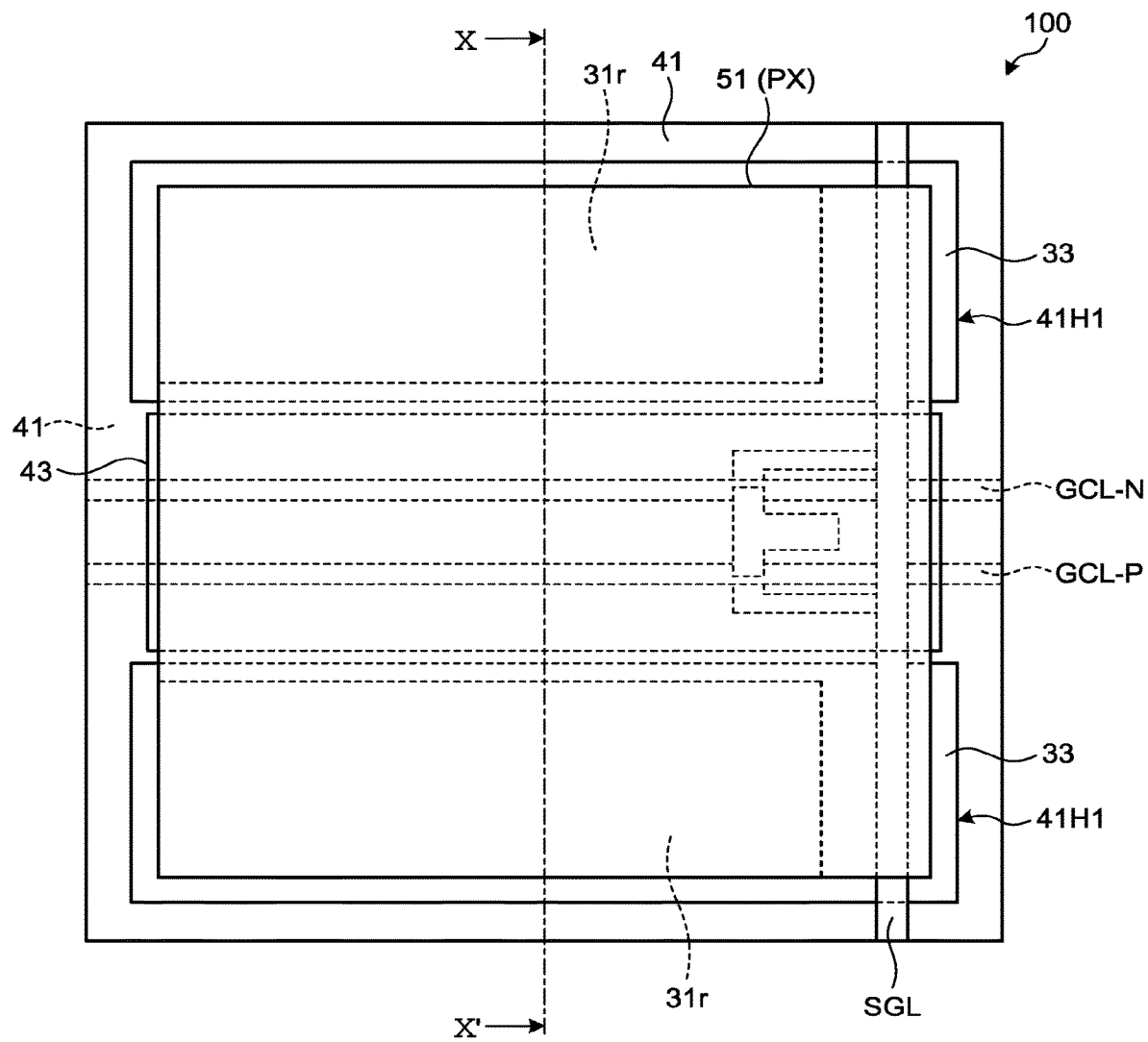
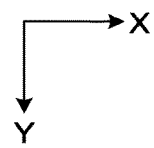

SUBSTRATE AND ELECTROPHORETIC DEVICE

CROSS-REFERENCE TO RELATED APPLICATIONS

This application claims priority from Japanese Application No. 2017-212036, filed on Nov. 1, 2017, the contents of which are incorporated by reference herein in its entirety.

BACKGROUND

1. Technical Field

The present disclosure relates to a substrate and an electrophoretic device.

2. Description of the Related Art

Recent years have seen a growing demand for display devices for use in, for example, mobile electronic apparatuses, such as mobile phones and electronic paper. For example, an electrophoretic display (EPD) used in the electronic paper has a memory property in which a potential at the time of rewriting an image is maintained. When the EPD performs the rewriting once for each frame, the potential at the time of the rewriting is maintained until the EPD performs the rewriting for the next frame. As a result, the EPD can perform low power consumption driving. Japanese Patent Application Laid-open Publication No. 2011-221125 A discloses a technique to achieve the low power consumption by configuring pixel transistors of the EPD in a complementary metal-oxide semiconductor (CMOS) configuration obtained by combining p-channel transistors with n-channel transistors.

For example, under an outdoor environment where intense light is radiated, the light incident on a display surface may reach the pixel transistors. The intense light entering the pixel transistors generates a photo leakage current due to a photoconductivity effect, and may cause a malfunction of the pixel transistors.

SUMMARY

A substrate according to one embodiment includes a base material having an insulating property, a pixel electrode provided on one surface side of the base material, a pixel transistor provided between the base material and the pixel electrode, a first reflective film provided between the pixel transistor and the pixel electrode, and a common electrode provided between the pixel transistor and the first reflective film. The first reflective film has a first through-hole, the common electrode has a second through-hole, and a drain of the pixel transistor is coupled to the pixel electrode through the first through-hole and the second through-hole.

A substrate according to another embodiment includes a first gate line, a second gate line parallel to the first gate line, a signal line that intersects the first gate line and the second gate line in the plan view, and a semiconductor film that intersects the first gate line and the second gate line in the plan view and is coupled to the signal line. The semiconductor film has a ring shape in the plan view.

An electrophoretic device according to one embodiment includes a substrate, and an electrophoretic layer disposed so as to be opposed to the substrate. The substrate includes a base material having an insulating property, a pixel electrode provided on one surface side of the base material, a pixel transistor provided between the base material and the pixel electrode, and a first reflective film provided between the pixel transistor and the pixel electrode, the pixel transistor comprises a gate, a source, and a drain, the first reflective film has a first through-hole, and the drain is coupled to the pixel electrode through the first through-hole.

BRIEF DESCRIPTION OF THE DRAWINGS

FIG. 4 is a plan view illustrating a configuration example of one of the pixels on the TFT substrate according to the first embodiment;

DETAILED DESCRIPTION

Figure 1:
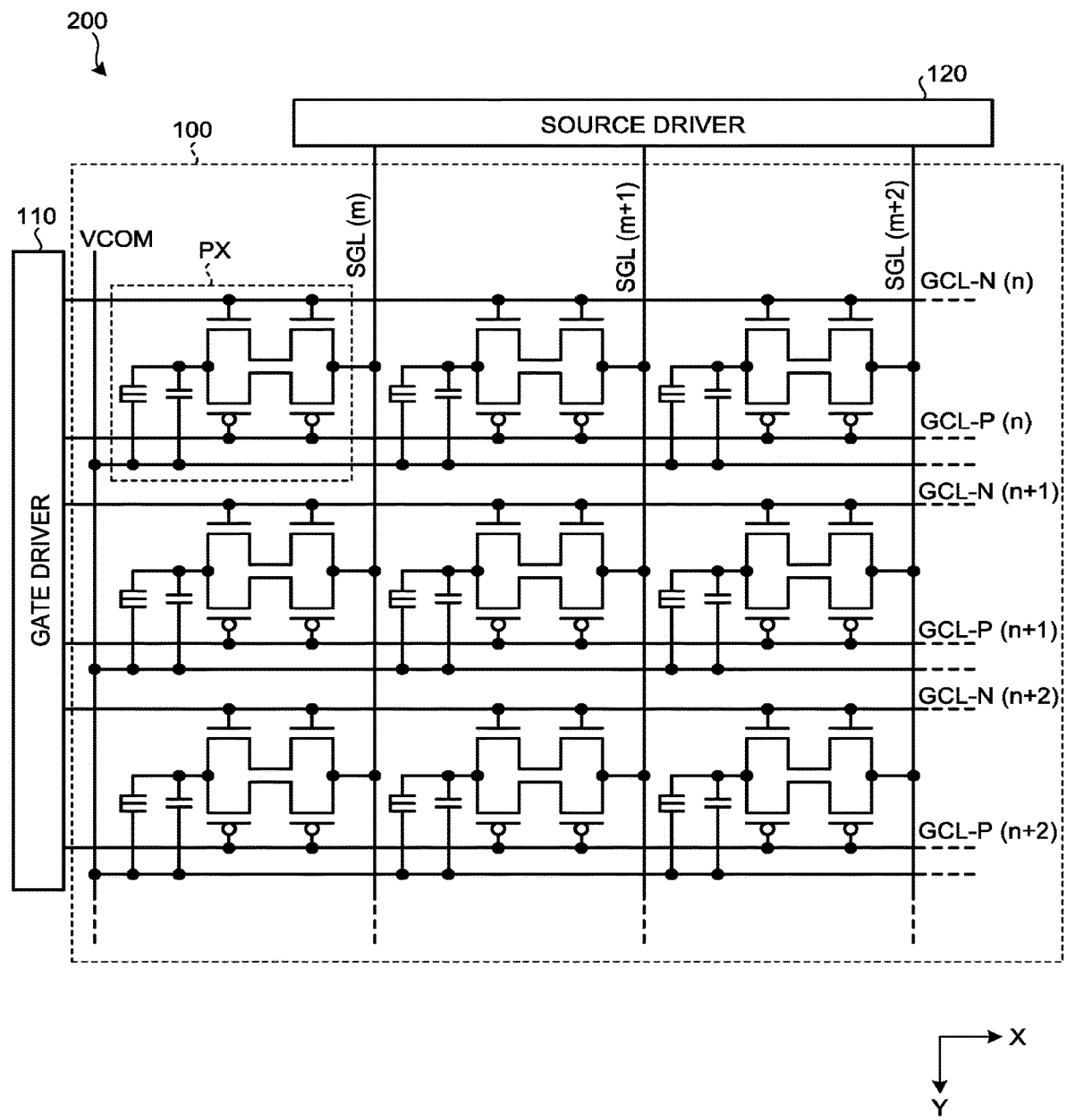
FIG. 1 is a block diagram illustrating a configuration example of a display device according to a first embodiment of the present disclosure.

The following describes modes (embodiments) for carrying out the present disclosure in detail with reference to the drawings. The present disclosure is not limited to the description of the embodiments to be given below. Components to be described below include those easily conceivable by those skilled in the art or those substantially identical thereto. Furthermore, the components to be described below can be combined as appropriate. The disclosure is merely an example, and the present disclosure naturally encompasses appropriate modifications easily conceivable by those skilled in the art while maintaining the gist of the disclosure. To further clarify the description, widths, thicknesses, shapes, and the like of various parts will be schematically illustrated in the drawings as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

First Embodiment

Figure 2:
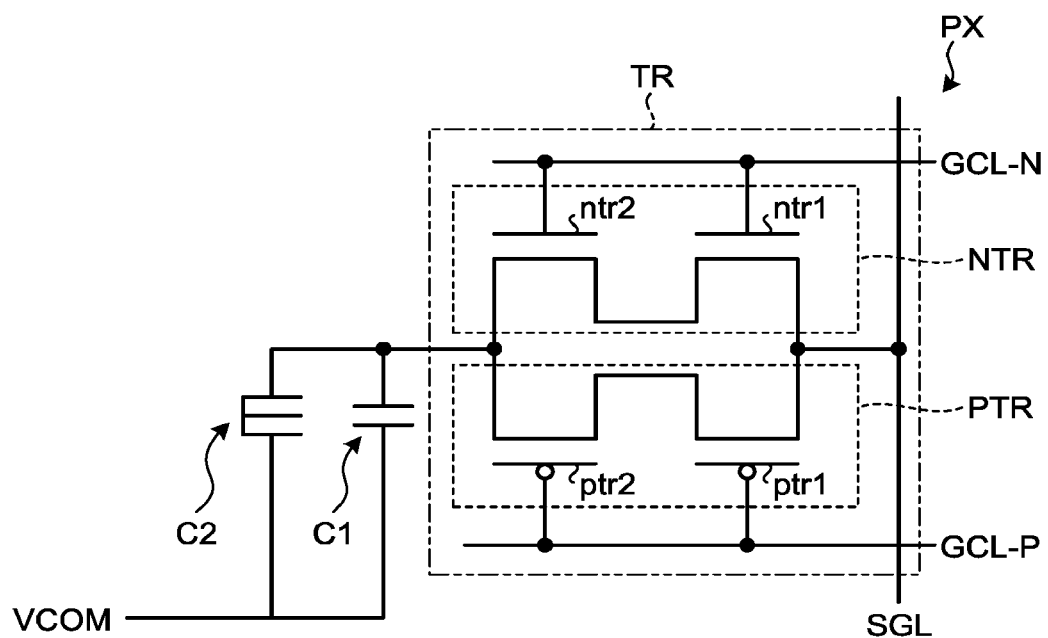
FIG. 2 is a circuit diagram illustrating a configuration example of one pixel on a thin-film transistor (TFT) substrate according to the first embodiment.

FIG. 1 is a block diagram illustrating a configuration example of a display device according to a first embodiment of the present disclosure. FIG. 2 is a circuit diagram illustrating a configuration example of one pixel on a thin-film transistor (TFT) substrate according to the first embodiment. A display device 200 according to the first embodiment is mounted on, for example, an electronic apparatus (not illustrated). A power supply voltage is applied from a power supply circuit of the electronic apparatus to the display device 200, which performs image display based on a signal output from a control circuit that is a host processor of the electronic apparatus. Examples of the display device 200 include, but are not limited to, an electrophoretic display (EPD) including an electrophoretic layer 160 (refer to FIG. 20 to be discussed later). As illustrated in FIG. 1, the display device 200 includes a TFT substrate 100, a gate driver 110 coupled to the TFT substrate 100, and a source driver 120 coupled to the TFT substrate 100.

As illustrated in FIG. 1, the TFT substrate 100 includes a plurality of pixels PX, a plurality of first gate lines GCL-N (n), GCL-N(n+1), GCL-N(n+2), . . . , a plurality of second gate lines GCL-P(n), GCL-P(n+1), GCL-P(n+2), . . . , and a plurality of signal lines SGL(m), SGL(m+1), SGL (m+2), . . . , where n and m are integers equal to or larger than 1. In the following description, the first gate lines GCL-N(n), GCL-N(n+1), GCL-N(n+2), . . . will each be called a first gate line GCL-N when they need not be distinguished from one another. In the same manner, the second gate lines GCL-P(n), GCL-P(n+1), GCL-P (n+2), . . . will each be called a second gate line GCL-P when they need not be distinguished from one another. The signal lines SGL(m), SGL(m+1), SGL(m+2), . . . will each be called a signal line SGL when they need not be distinguished from one another.

The pixels PX are arranged side by side in the X-direction and the Y-direction intersecting the X-direction, and are arranged in a two-dimensional matrix. The first gate lines GCL-N extend in the X-direction, and are arranged side by side in the Y-direction. The second gate lines GCL-P also extend in the X-direction, and are arranged side by side in the Y-direction. The first gate lines GCL-N and the second gate lines GCL-P are alternately arranged side by side in the Y-direction. For example, the first gate lines GCL-N and the second gate lines GCL-P are arranged side by side in the Y-direction in the order of the first gate line GCL-N(n), the second gate line GCL-P(n), the first gate line GCL-N(n+1), the second gate line GCL-P(n+1), . . . . The signal lines SGL extend in the Y-direction, and are arranged side by side in the X-direction. With this arrangement, each of the signal lines SGL is orthogonal to the first gate lines GCL-N and the second gate lines GCL-P in a plan view. The plan view refers to a view from a direction normal to one surface 1*a* of a base material 1 of the TFT substrate 100 (refer to FIG. 11 to be discussed later).

Each of the first gate lines GCL-N and the second gate lines GCL-P is coupled to the gate driver 110. Each of the signal lines SGL is coupled to the source driver 120.

The gate driver 110 generates a first gate drive signal and a second gate drive signal based on the signal output from the above-described control circuit. The gate driver 110 supplies the first gate drive signal to the first gate lines GCL-N, and supplies the second gate drive signal to the second gate lines GCL-P. The source driver 120 generates a source drive signal based on the signal output from the above-described control circuit. The source driver 120 supplies the source drive signal to the signal lines SGL.

Figure 20:
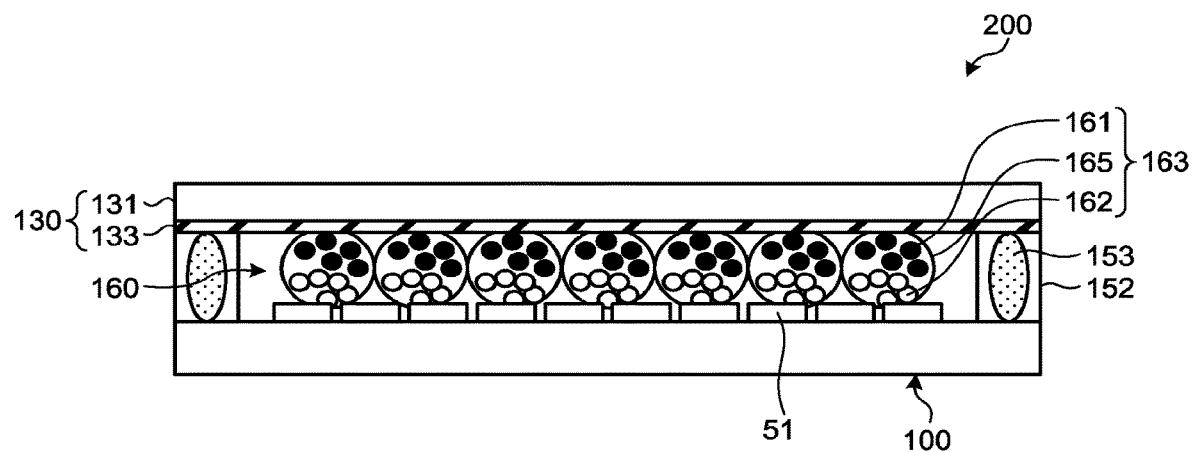
FIG. 20 is a sectional view illustrating a configuration example of a display device 200 according to the first embodiment.

The gate driver 110 and the source driver 120 may be provided on the TFT substrate 100, or may be provided on a counter substrate 130 (refer to FIG. 20 to be discussed later). The gate driver 110 and the source driver 120 may be included in an integrated circuit (IC) mounted on another circuit substrate (such as a flexible substrate) coupled to the TFT substrate 100.

As illustrated in FIG. 2, each of the pixels PX of the TFT substrate 100 includes a pixel transistor TR. For example, the pixel transistor TR has a complementary metal-oxide semiconductor (MOS) (CMOS) configuration, and includes an n-channel metal-oxide semiconductor (NMOS) transistor NTR and a p-channel metal-oxide semiconductor (PMOS) transistor PTR. Each of the NMOS transistor NTR and the PMOS transistor PTR is, for example, a bottom-gate transistor.

The NMOS transistor NTR is coupled in parallel to the PMOS transistor PTR. The source of the NMOS transistor NTR and the source of the PMOS transistor PTR are coupled to the signal line SGL. The drain of the NMOS transistor NTR is coupled to the drain of the PMOS transistor PTR. In the first embodiment, the source of the NMOS transistor NTR and the source of the PMOS transistor PTR are configured as a common source 31*s* (refer to FIG. 6 to be discussed later). The drain of the NMOS transistor NTR and the drain of the PMOS transistor PTR are configured as a common drain 31*d* (refer to FIG. 6 to be discussed later).

The NMOS transistor NTR includes a first NMOS transistor ntr1 and a second NMOS transistor ntr2. The first NMOS transistor ntr1 is coupled in series to the second NMOS transistor ntr2. The PMOS transistor PTR includes a first PMOS transistor ptr1 and a second PMOS transistor ptr2. The first PMOS transistor ptr1 is coupled in series to the second PMOS transistor ptr2.

The gate of the NMOS transistor NTR includes a gate n1g (refer to FIG. 16 to be discussed later) of the first NMOS transistor ntr1 and a gate n2g (refer to FIG. 16 to be discussed later) of the second NMOS transistor ntr2. The gate of the NMOS transistor NTR is coupled to the first gate line GCL-N. The source of the NMOS transistor NTR is coupled to the signal line SGL. The drain of the NMOS transistor NTR is coupled to a pixel electrode 51 (refer to FIG. 3 to be discussed later). The source of the NMOS transistor NTR is supplied with the source drive signal (video signal) from the signal line SGL. The gate of the NMOS transistor NTR is supplied with the first gate drive signal from the first gate line GCL-N. When the voltage of the first gate drive signal supplied to the NMOS transistor NTR increases to a predetermined value or higher, the NMOS transistor NTR is turned on. As a result, the source drive signal (video signal) is supplied from the signal line SGL to the pixel electrode 51 through the NMOS transistor NTR.

The gate of the PMOS transistor PTR includes a gate p1g (refer to FIG. 16 to be discussed later) of the first PMOS transistor ptr1 and a gate p2g (refer to FIG. 16 to be discussed later) of the second PMOS transistor ptr2. The gate of the PMOS transistor PTR is coupled to the second gate line GCL-P. The source of the PMOS transistor PTR is coupled to the signal line SGL. The drain of the PMOS transistor PTR is coupled to the pixel electrode 51. The source of the PMOS transistor PTR is supplied with the source drive signal (video signal) from the signal line SGL. The gate of the PMOS transistor PTR is supplied with the second gate drive signal from the second gate line GCL-P. When the voltage of the second gate drive signal supplied to the PMOS transistor PTR decreases to a predetermined value or lower, the PMOS transistor PTR is turned on. As a result, the source drive signal (video signal) is supplied from the signal line SGL to the pixel electrode 51 through the PMOS transistor PTR.

Each of the pixels PX of the TFT substrate 100 has first retention capacitance C1 and second retention capacitance C2. The first retention capacitance C1 is generated between the pixel electrode 51 and a common electrode 41 (refer to FIG. 11 to be discussed later). The second retention capacitance C2 is generated between a counter electrode 133 of the counter substrate 130 (refer to FIG. 20 to be discussed later) and the pixel electrode 51. The pixel electrode 51 is supplied with the source drive signal (video signal) from the signal line SGL through the pixel transistor TR. The common electrode 41 and the counter electrode 133 are supplied with a common potential VCOM. The potential of the source drive signal (video signal) supplied to the pixel electrode 51 is retained by the first retention capacitance C1 and the second retention capacitance C2.

Figure 3:
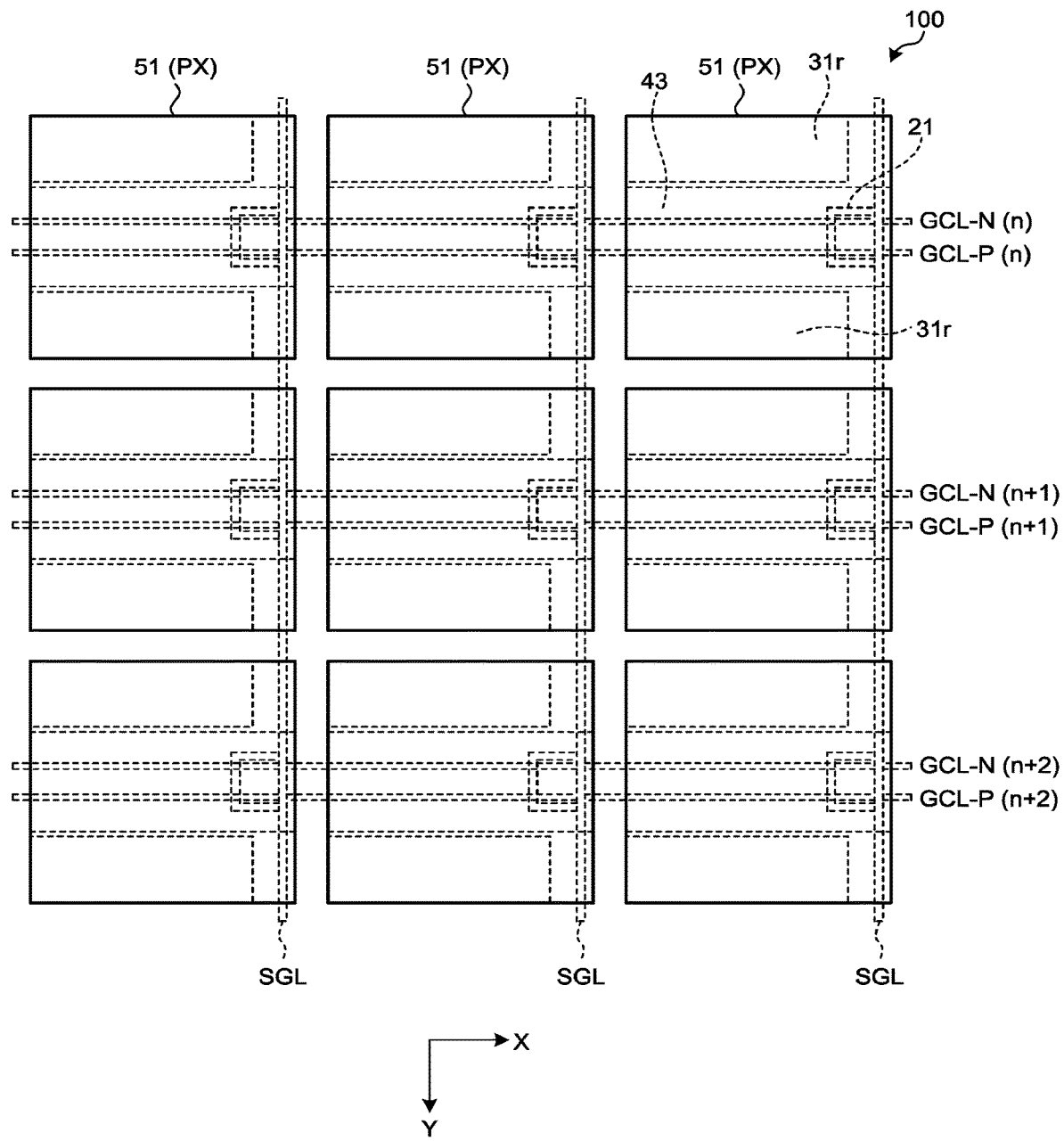
FIG. 3 is a plan view illustrating an arrangement example of a plurality of pixels on the TFT substrate according to the first embodiment.
Figure 5:
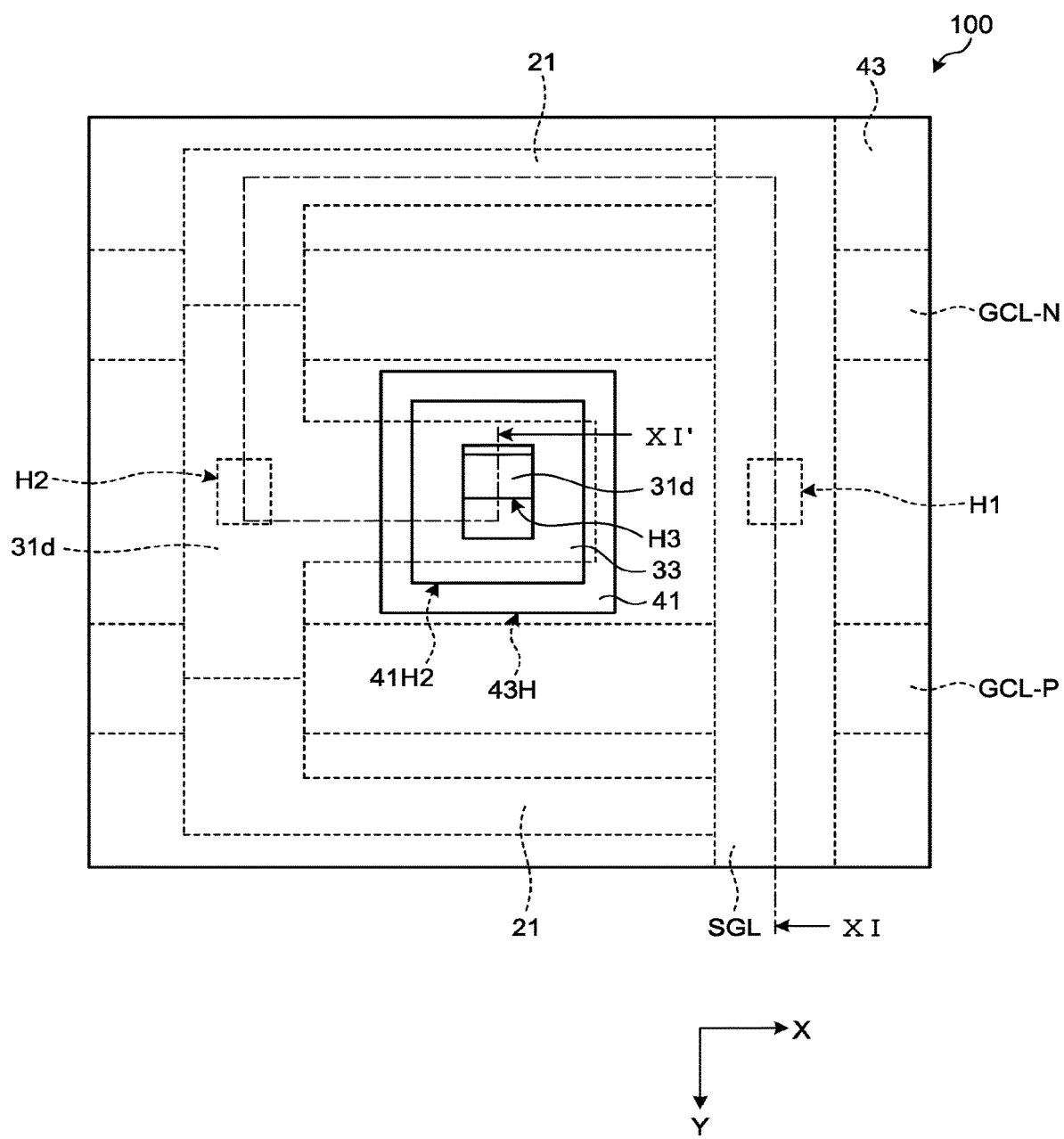
FIG. 5 is an enlarged view of a third contact hole and the periphery thereof in the plan view illustrated in FIG. 4.
Figure 6:
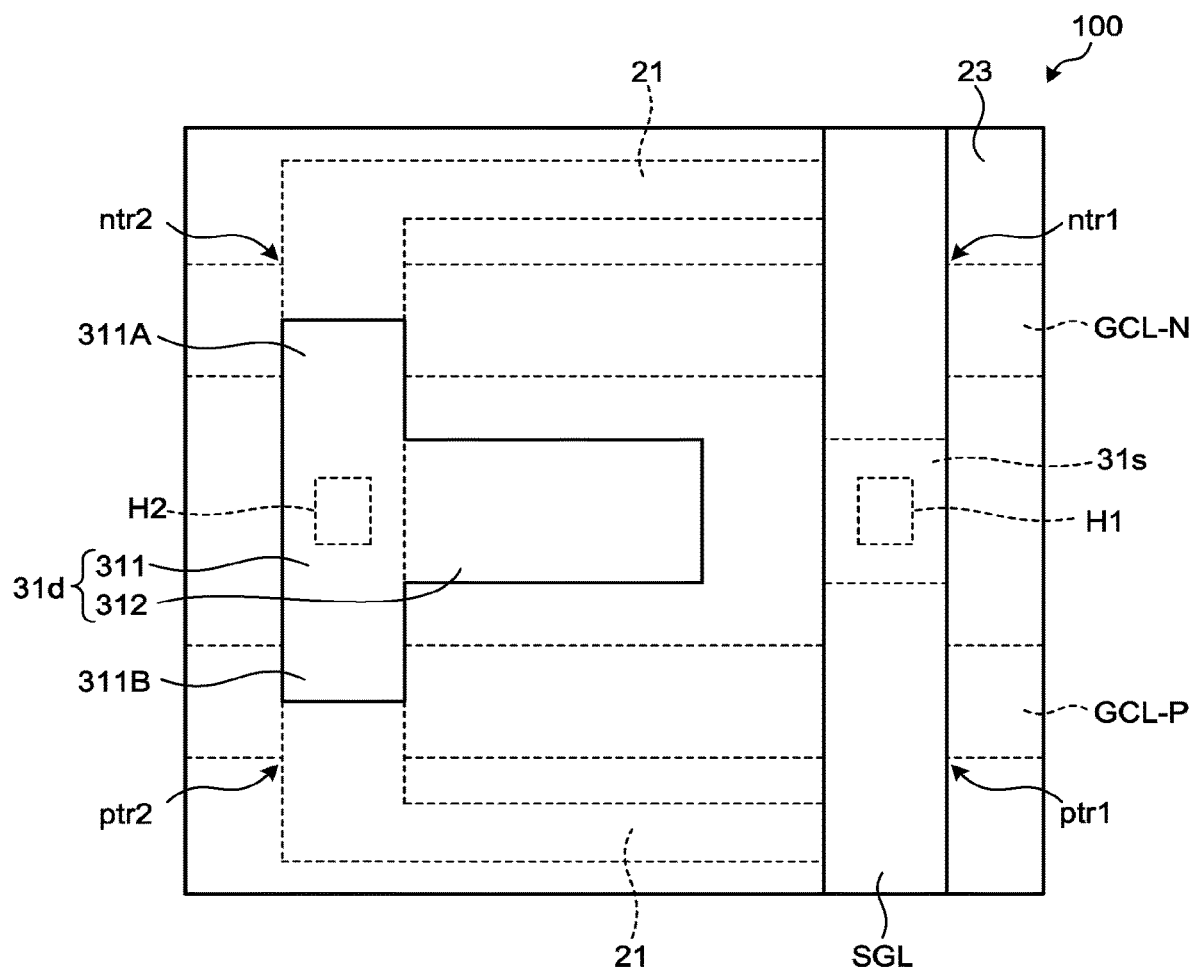
FIG. 6 is a view obtained by omitting a pixel electrode, a first reflective film, a common electrode, and a planarizing film from the plan view illustrated in FIG. 4.
Figure 7:
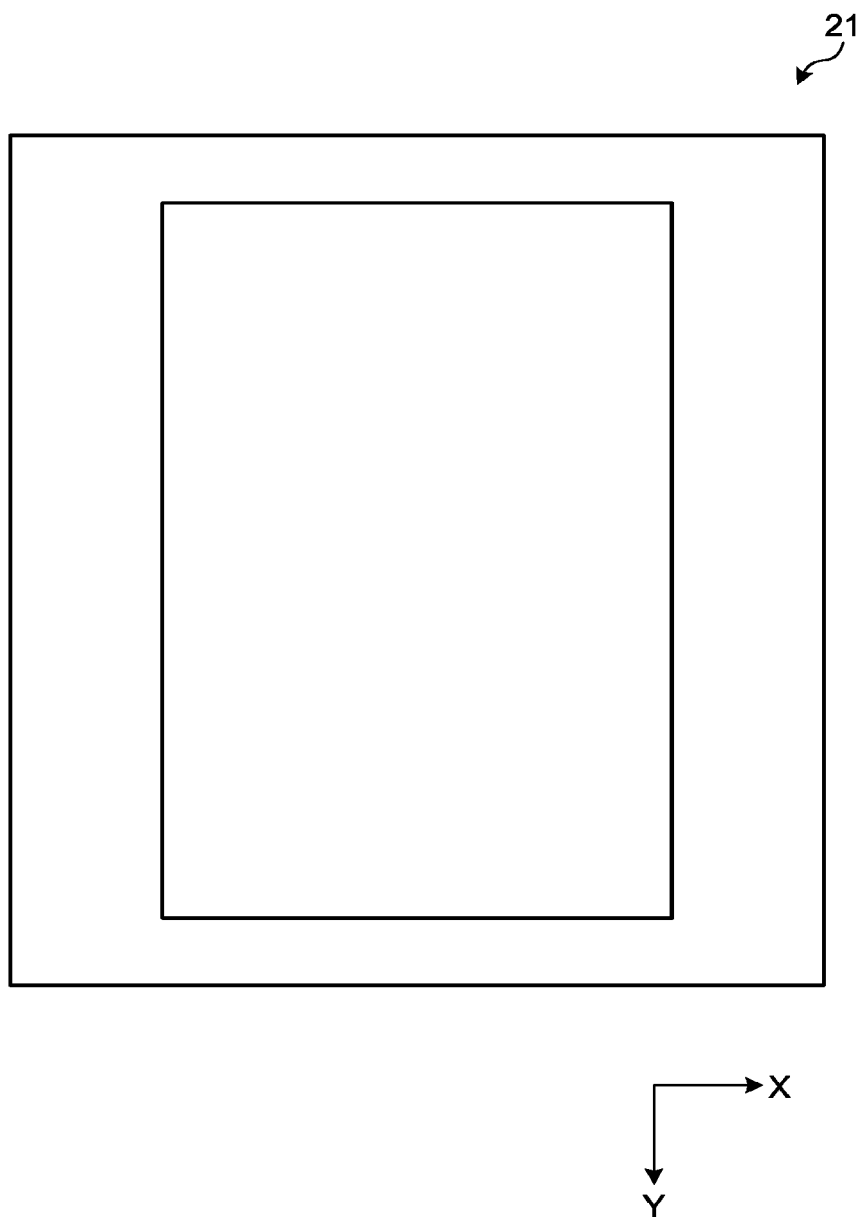
FIG. 7 is a plan view illustrating a configuration example of a semiconductor film according to the first embodiment.
Figure 8:
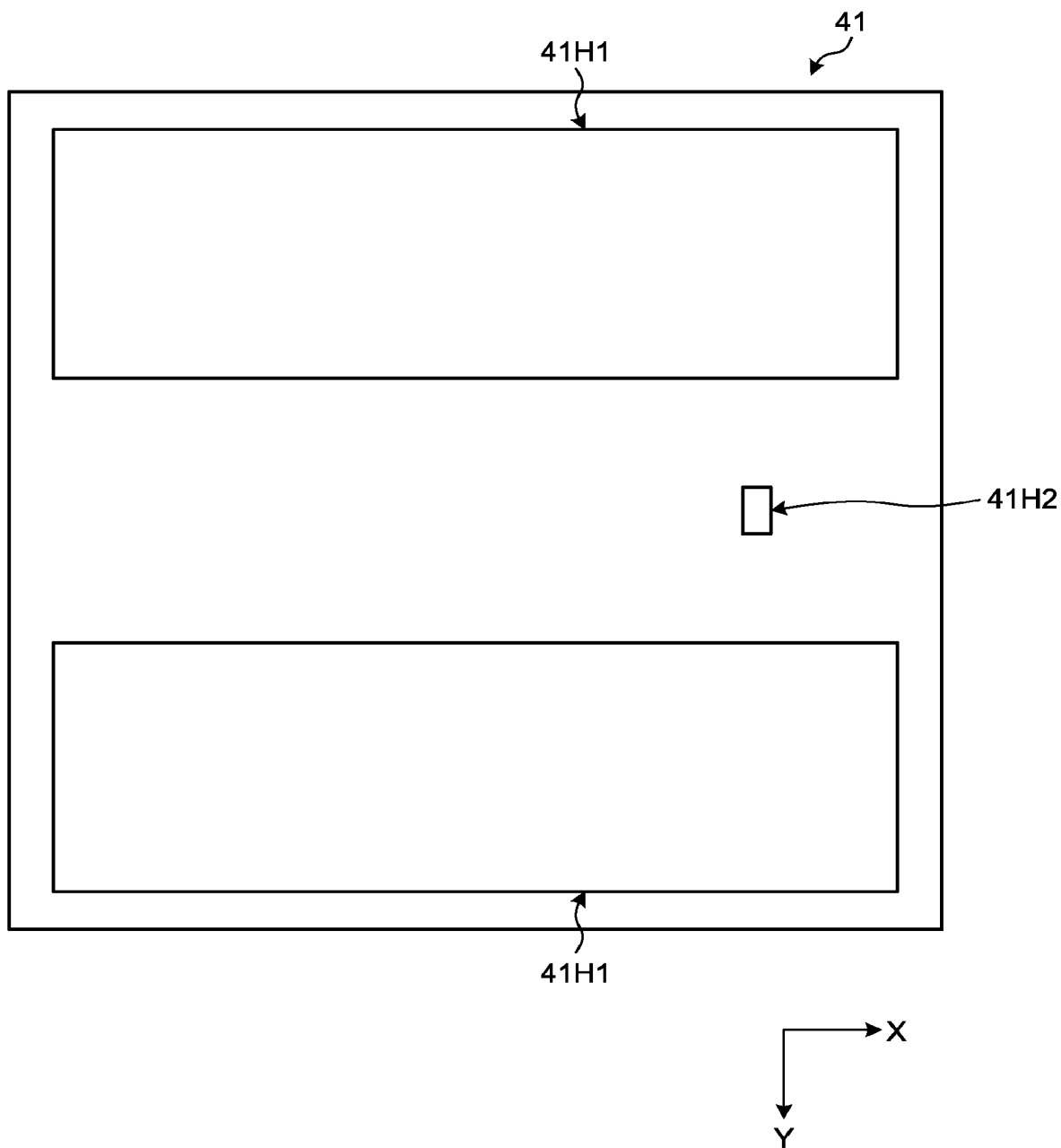
FIG. 8 is a plan view illustrating a configuration example of the common electrode according to the first embodiment.
Figure 9:
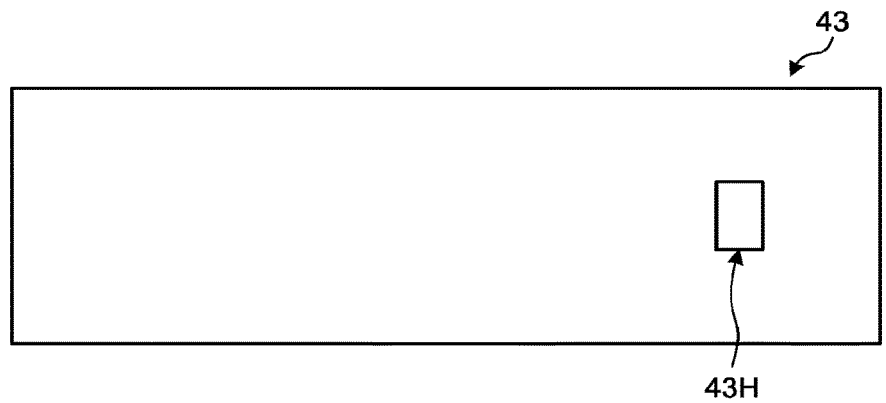
FIG. 9 is a plan view illustrating a configuration example of the first reflective film according to the first embodiment.
Figure 10:
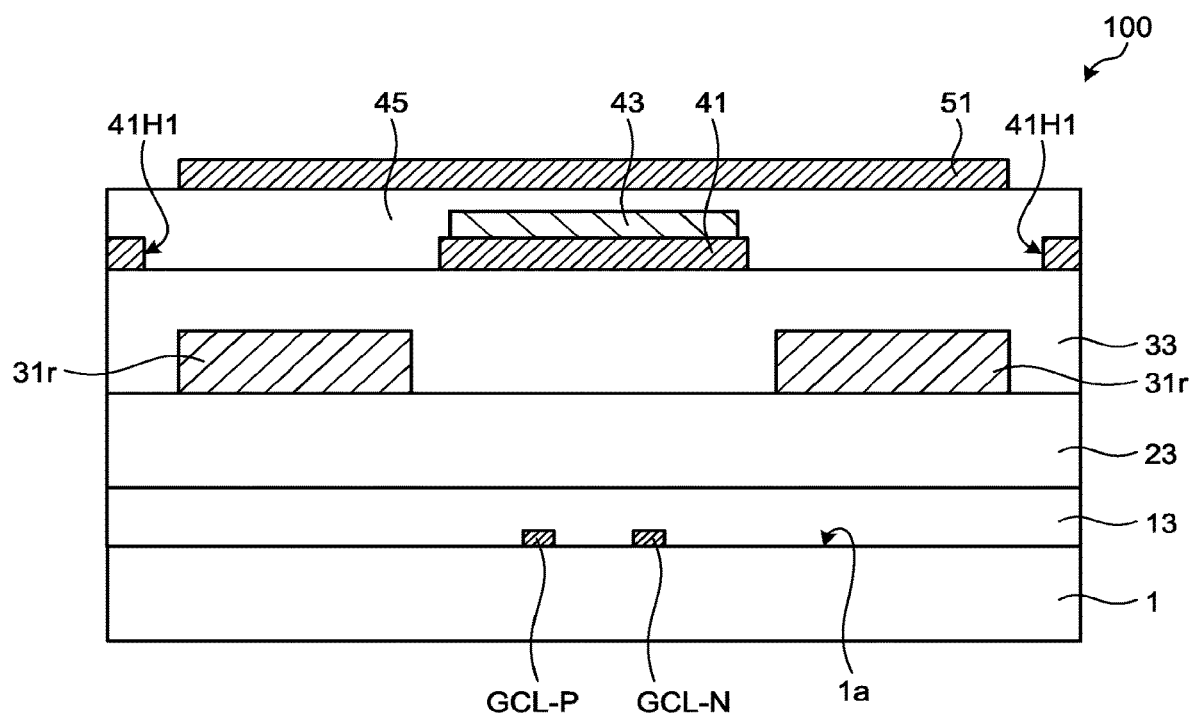
FIG. 10 is a sectional view obtained by cutting the plan view illustrated in FIG. 4 along line X-X'.
Figure 11:
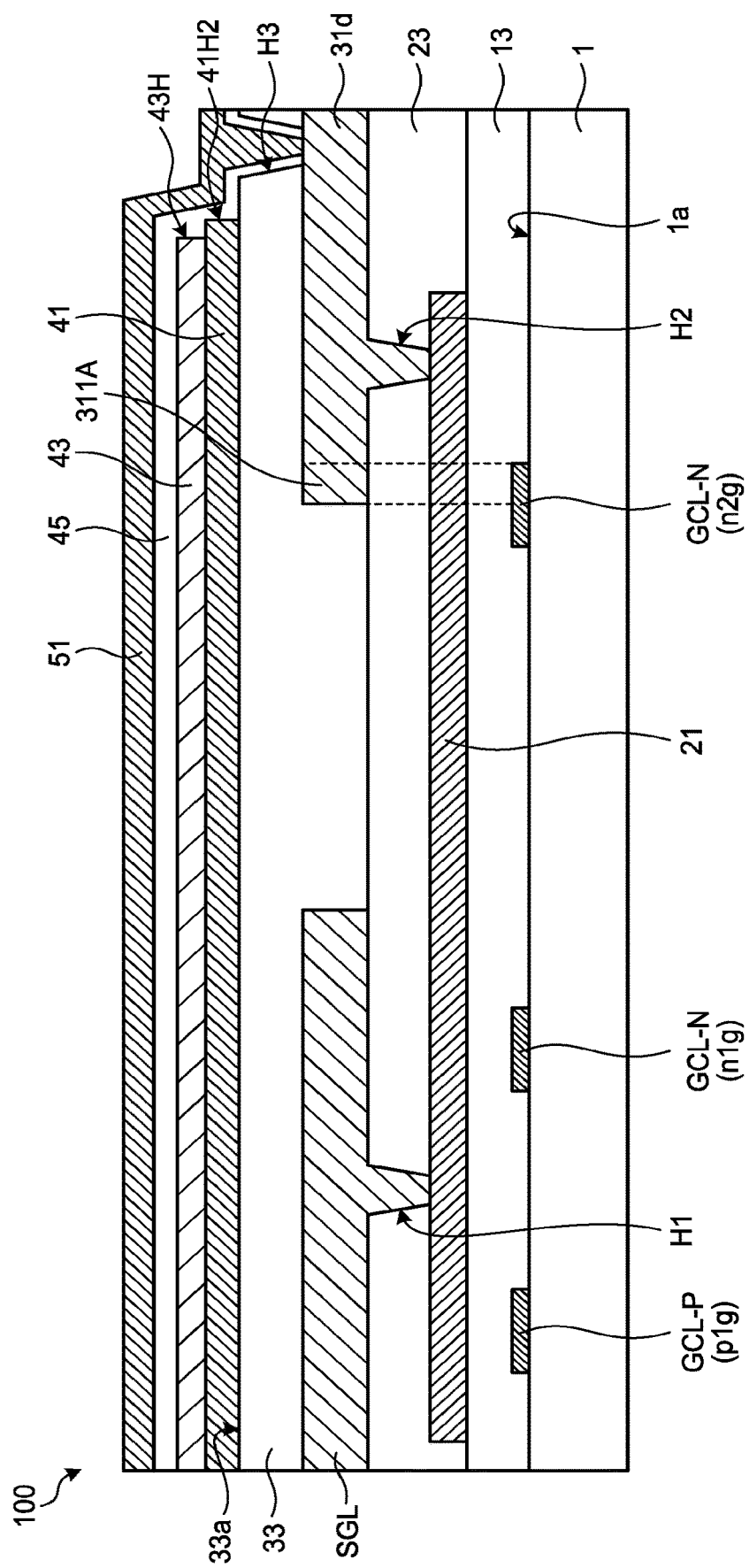
FIG. 11 is a sectional view obtained by cutting the plan view illustrated in FIG. 5 along line XI-XI'.

The following describes the structure of the TFT substrate. FIG. 3 is a plan view illustrating an arrangement example of the pixels on the TFT substrate according to the first embodiment. FIG. 4 is a plan view illustrating a configuration example of one of the pixels on the TFT substrate according to the first embodiment. To facilitate viewing of the structure of portions located below (that is, on the base material 1 of) the pixel electrode 51, FIG. 4 does not illustrate an insulating film 45. FIG. 5 is an enlarged view of a third contact hole and the periphery thereof in the plan view illustrated in FIG. 4. FIG. 6 is a view obtained by omitting the pixel electrode, a first reflective film, the common electrode, and a planarizing film from the plan view illustrated in FIG. 4. FIG. 7 is a plan view illustrating a configuration example of a semiconductor film according to the first embodiment. FIG. 8 is a plan view illustrating a configuration example of the common electrode according to the first embodiment. FIG. 9 is a plan view illustrating a configuration example of the first reflective film according to the first embodiment. FIG. 10 is a sectional view obtained by cutting the plan view illustrated in FIG. 4 along line X-X'. FIG. 11 is a sectional view obtained by cutting the plan view illustrated in FIG. 5 along line XI-XI'.

As illustrated in FIGS. 10 and 11, the TFT substrate 100 includes the base material 1, the first gate line GCL-N and the second gate line GCL-P provided on the surface 1a of the base material 1, and a gate insulating film 13 provided on the surface 1a of the base material 1. The gate insulating film 13 covers the first gate line GCL-N and the second gate line GCL-P.

The TFT substrate 100 also includes a semiconductor film 21 provided on the gate insulating film 13 and an interlayer insulating film 23 provided on the gate insulating film 13. The interlayer insulating film 23 covers the semiconductor film 21. The interlayer insulating film 23 is provided with a first contact hole H1 and a second contact hole H2. Each of the first contact hole H1 and the second contact hole H2 is a through-hole with the semiconductor film 21 serving as a bottom surface thereof.

Figure 16:
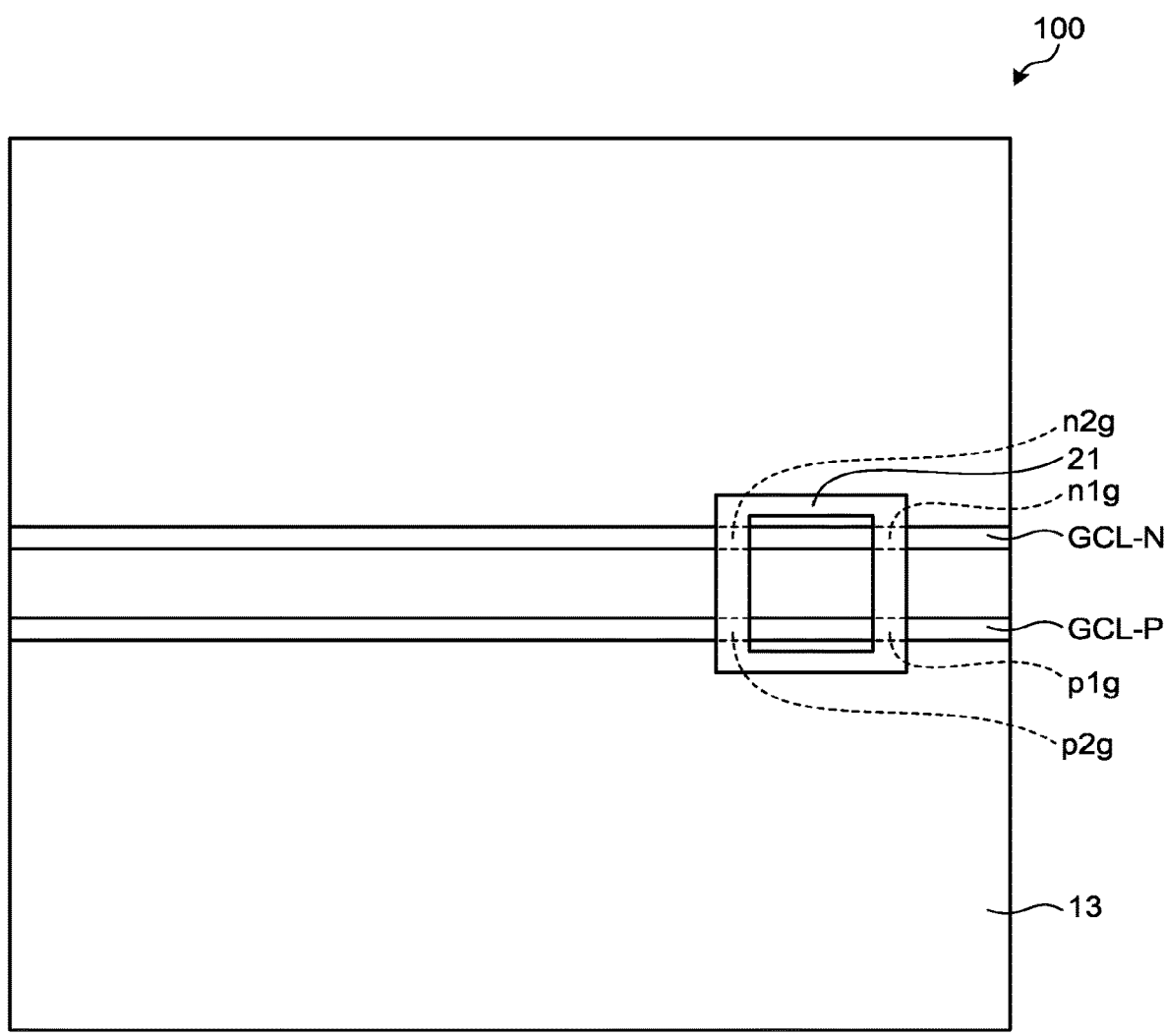
FIG. 16 is a plan view for explaining the manufacturing method of the TFT substrate.

As illustrated in FIG. 7, the shape in the plan view of the semiconductor film 21 is, for example, a rectangular ring shape. As illustrated in FIG. 16 to be discussed later, the first gate line GCL-N intersects the ring-shaped semiconductor film 21 in the plan view. A portion of the first gate line GCL-N intersecting the ring-shaped semiconductor film 21 serves as the gate of the NMOS transistor NTR. A portion of the ring-shaped semiconductor film 21 intersecting the first gate line GCL-N serves as the channel of the NMOS transistor NTR. In the same manner, the second gate line GCL-P also intersects the ring-shaped semiconductor film 21 in the plan view. A portion of the second gate line GCL-P intersecting the ring-shaped semiconductor film 21 serves as the gate of the PMOS transistor PTR. A portion of the ring-shaped semiconductor film 21 intersecting the second gate line GCL-P serves as the channel of the PMOS transistor PTR. The semiconductor film 21 is coupled to the signal line SGL.

As illustrated in FIGS. 6, 10, and 11, the TFT substrate 100 also includes the signal line SGL, the source 31s and the drain 31d of the pixel transistor TR (refer to FIG. 2), and a second reflective film 31r. The signal line SGL, the source 31s and the drain 31d, and the second reflective film 31r are provided on the interlayer insulating film 23. That is, the signal line SGL, the source 31s and the drain 31d, and the second reflective film 31r are provided in the same layer.

A portion of the signal line SGL with the first contact hole H1 buried and the periphery thereof serve as the source 31s of the pixel transistor TR. The drain 31d is disposed at a location away from the signal line SGL, and has the second contact hole H2 buried therein. The signal line SGL, the source 31s and the drain 31d, and the second reflective film 31r are made of, for example, conductive films having the same composition. The shape in the plan view of the second reflective film 31r is, for example, a rectangle. The source 31s can be called a source electrode. The drain 31d can be called a drain electrode.

As illustrated in FIG. 6, the shape in the plan view of the drain 31d is, for example, a T-shape. The drain 31d includes a linear first portion 311 and a linear second portion 312. The second portion 312 is coupled to a central portion in the longitudinal direction of the first portion 311. The first portion 311 and the second portion 312 form an angle of substantially 90 degrees.

The first portion 311 includes a first end portion 311A and a second end portion 311B. The first end portion 311A is located on one end side in the longitudinal direction of the first portion 311. The second end portion 311B is located on the other end side in the longitudinal direction of the first portion 311. The first end portion 311A overlaps the first gate line GCL-N in the plan view. The second end portion 311B overlaps the second gate line GCL-P in the plan view.

As illustrated in FIGS. 10 and 11, the TFT substrate 100 also includes an insulating planarizing film 33 provided on the interlayer insulating film 23. The planarizing film 33 covers the signal line SGL. An upper surface 33a of the planarizing film 33 is flat and parallel to the surface 1a of the base material 1. The planarizing film 33 is provided with a third contact hole H3. As illustrated in FIGS. 5 and 11, the third contact hole H3 is a through-hole with the drain 31d of the pixel transistor TR (refer to FIG. 2) serving as a bottom surface thereof.

As illustrated in FIGS. 10 and 11, the TFT substrate 100 also includes the common electrode 41 provided on the planarizing film 33, a first reflective film 43 provided on the common electrode 41, and the insulating film 45 provided on the planarizing film 33. As illustrated in FIG. 8, the common electrode 41 is provided with two through-holes 41H1 and one through-hole 41H2. As illustrated in FIG. 4, the through-holes 41H1 surround the second reflective film 31r in the plan view. As illustrated in FIG. 5, the through-hole 41H2 surrounds the third contact hole H3 in the plan view.

As illustrated in FIG. 9, the shape in the plan view of the first reflective film 43 is, for example, a rectangle. The first reflective film 43 is provided with one through-hole 43H. As illustrated in FIG. 5, the through-hole 43H surrounds the through-hole 41H2. As illustrated in FIG. 4, the first reflective film 43 and the second reflective film 31r are arranged side by side in the plan view in each of the pixels PX.

As illustrated in FIGS. 10 and 11, the insulating film 45 covers the common electrode 41 and the first reflective film 43. The insulating film 45 also covers an internal surface of each of the third contact hole H3 and the through-holes 41H1, 41H2, and 43H. The insulating film 45 serves as a dielectric material of the first retention capacitance C1 (refer to FIG. 2) and also as a portion of a dielectric material of the second retention capacitance C2 (refer to FIG. 2).

As illustrated in FIGS. 4, 10, and 11, the TFT substrate 100 also includes the pixel electrode 51 provided on the insulating film 45. The pixel electrode 51 covers the common electrode 41 with the insulating film 45 interposed therebetween. The pixel electrode 51 has the third contact hole H3 buried therein. Thus, the pixel electrode 51 is coupled to the drain 31d of the pixel transistor TR.

The shape in the plan view of the pixel electrode 51 is, for example, a rectangle. As illustrated in FIG. 3, on the TFT substrate 100, the pixel electrodes 51 are arranged side by side in the X-direction and the Y-direction intersecting the X-direction, and are arranged in a two-dimensional matrix. In the present embodiment, an area overlapping each of the pixel electrodes 51 in the plan view serves as one of the pixels PX.

The following exemplifies materials constituting portions of the TFT substrate 100. The base material 1 is made of glass or a flexible resin substrate. The first gate line GCL-N and the second gate line GCL-P are made of a material containing molybdenum. The gate insulating film 13 is constituted by a silicon oxide film and a silicon nitride film.

The gate insulating film 13 is constituted by, for example, a multilayered structure film obtained by stacking a silicon oxide film and a silicon nitride film in this order from the base material 1 side. The semiconductor film 21 is constituted by a polysilicon film. The interlayer insulating film 23 is constituted by a silicon oxide film and a silicon nitride film. The interlayer insulating film 23 is constituted by, for example, a multilayered structure film obtained by stacking a silicon oxide film, a silicon nitride film, and another silicon oxide film in this order from the base material 1 side.

The signal line SGL (including the source 31s), the drain 31d, and the second reflective film 31r are made of titanium and aluminum. The signal line SGL, the drain 31d, and the second reflective film 31r are each constituted by, for example, a multilayered structure film obtained by stacking titanium, aluminum, and titanium in this order from the base material 1 side. The planarizing film 33 is made of an acrylic resin. The common electrode 41 is made of indium tin oxide (ITO) to serve as a light-transmitting conductive film. The first reflective film 43 is made of molybdenum and aluminum. The first reflective film 43 is constituted by, for example, a multilayered structure film obtained by stacking molybdenum, aluminum, and molybdenum in this order from the base material 1 side. Silver (Ag) may be used as the first reflective film 43 to further increase reflectance thereof. The insulating film 45 is constituted by a silicon nitride film. The pixel electrode 51 is made of ITO.

The above-mentioned materials are mere examples. In the present embodiment, the portions of the TFT substrate 100 may be made of materials other than those mentioned above. For example, the first gate line GCL-N and the second gate line GCL-P may each be constituted by a film of aluminum, copper, silver, molybdenum, or an alloy thereof. The signal line SGL, the drain 31d, and the second reflective film 31r may be made of titanium aluminum, which is a titanium-aluminum alloy.

The following describes a manufacturing method of the TFT substrate 100 according to the first embodiment with reference to sectional views and plan views. FIGS. 12 to 15 are sectional views for explaining the manufacturing method of the TFT substrate. FIGS. 16 to 19 are plan views for explaining the manufacturing method of the TFT substrate. FIGS. 12 to 15 correspond to the sectional view illustrated in FIG. 11, and illustrate a manufacturing process in the sectional plane of the sectional view. FIGS. 16 to 19 correspond to the plan view illustrated in FIG. 4, and illustrate the manufacturing process in the plane of the plan view.

Figure 12:
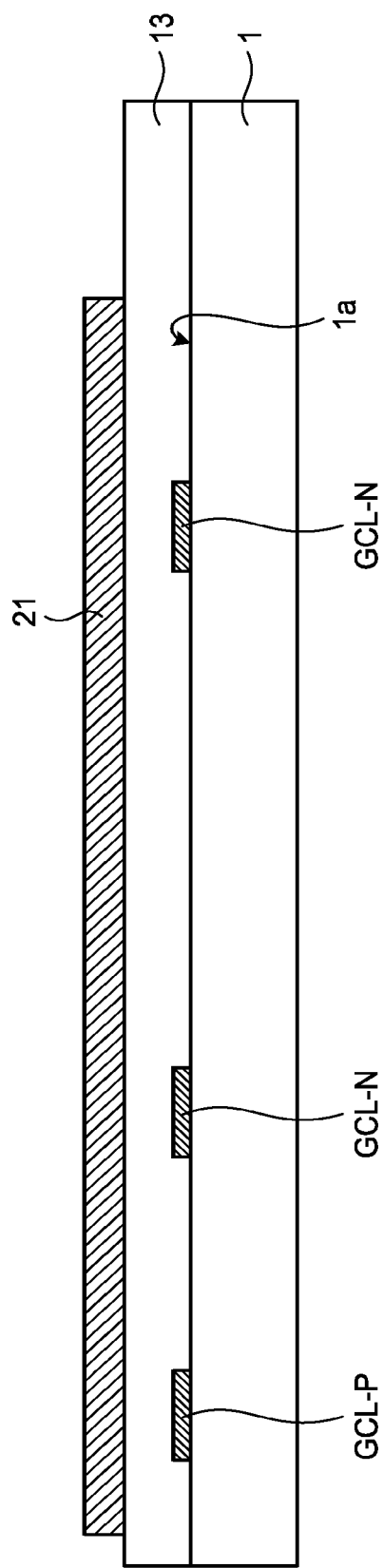
FIG. 12 is a sectional view for explaining a manufacturing method of the TFT substrate.

As illustrated in FIGS. 12 and 16, manufacturing equipment (not illustrated) first forms a conductive film (not illustrated) of, for example, molybdenum on the base material 1. The conductive film is formed using, for example, a sputtering method. The manufacturing equipment then patterns the conductive film using a photolithography technique and a dry etching technique to form the first gate line GCL-N and the second gate line GCL-P. For example, the manufacturing equipment forms a resist (not illustrated) on the conductive film. The resist is patterned by the photolithography to be formed into a shape that covers an area in which the first gate line GCL-N and the second gate line GCL-P are to be formed and that exposes the other area. The manufacturing equipment then uses the dry etching technique to remove the conductive film in the area exposed from the resist. This process forms the first gate line GCL-N and the second gate line GCL-P from the conductive film. After forming the first gate line GCL-N and the second gate line GCL-P, the manufacturing equipment removes the resist.

The manufacturing equipment then forms the gate insulating film 13 on the base material 1. The gate insulating film 13 is formed using, for example, a chemical vapor deposition (CVD) method. This process covers the first gate line GCL-N and the second gate line GCL-P with the gate insulating film 13. The manufacturing equipment then forms the semiconductor film 21 on the gate insulating film 13. The semiconductor film is formed using, for example, the CVD method. The manufacturing equipment then patterns the semiconductor film 21 using the photolithography technique and the dry etching technique. Thus, the manufacturing equipment forms the semiconductor film 21 having the ring shape in the plan view. After forming the semiconductor film 21, the manufacturing equipment removes the resist.

In the TFT substrate 100, one of two portions of the first gate line GCL-N overlapping the ring-shaped semiconductor film 21 in the plan view serves as the gate n1g of the first NMOS transistor ntr1, and the other of the two portions serves as the gate n2g of the second NMOS transistor ntr2. Also, one of two portions of the second gate line GCL-P overlapping the ring-shaped semiconductor film 21 in the plan view serves as the gate p1g of the first PMOS transistor ptr1, and the other of the two portions serves as the gate p2g of the second PMOS transistor ptr2.

Figure 13:
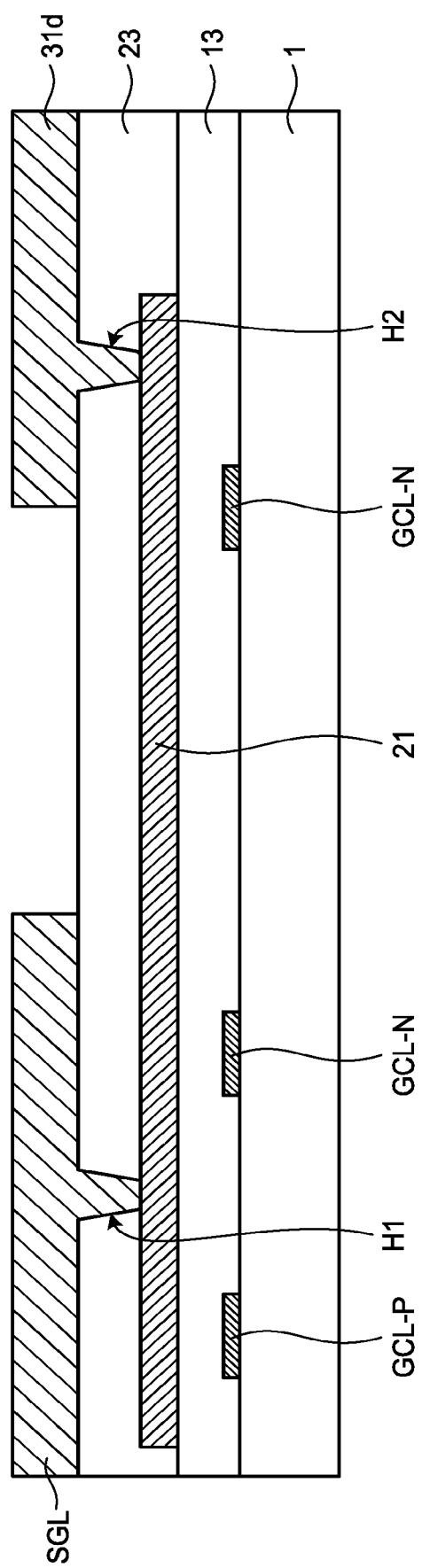
FIG. 13 is another sectional view for explaining the manufacturing method of the TFT substrate.
Figure 17:
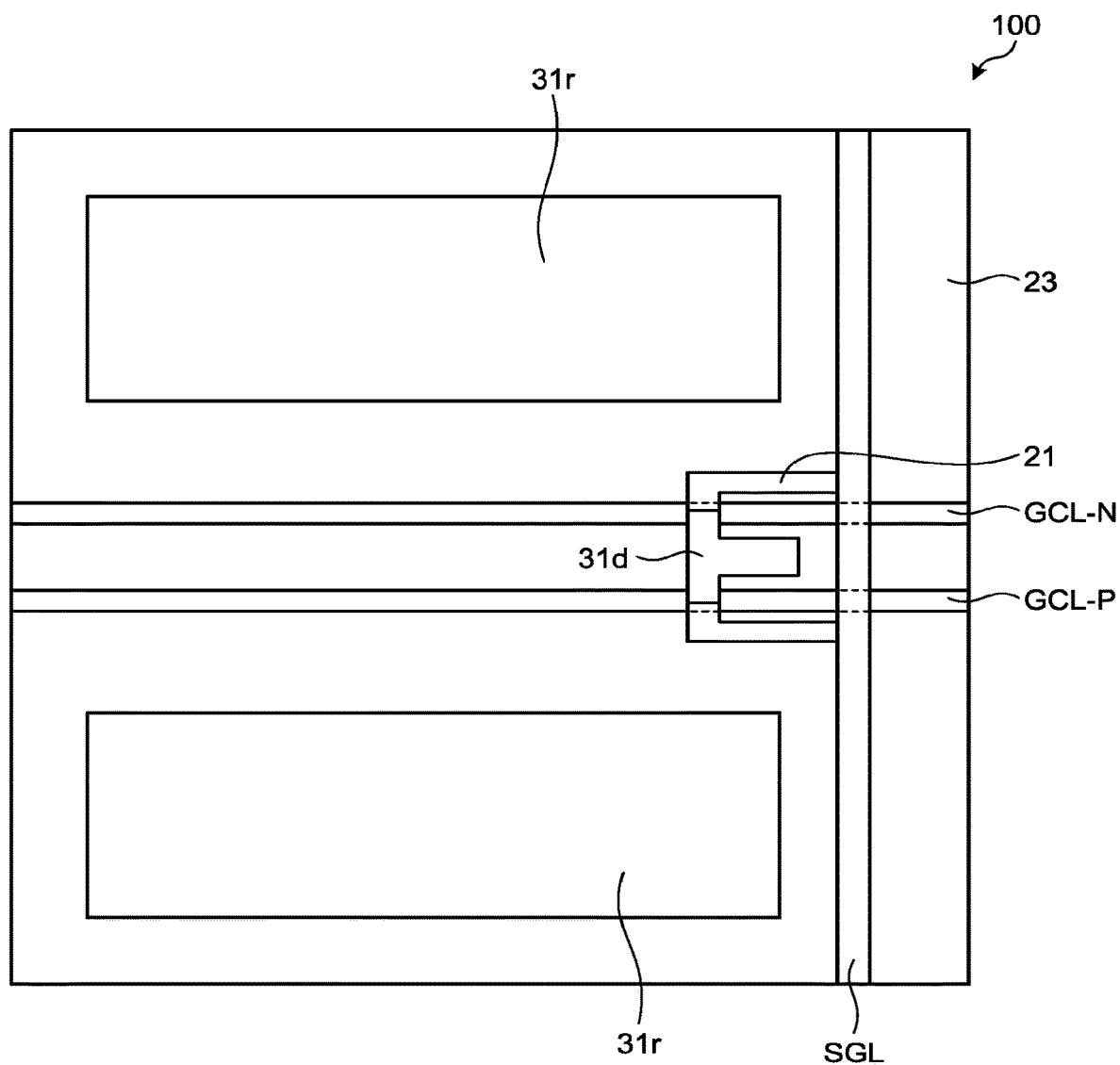
FIG. 17 is another plan view for explaining the manufacturing method of the TFT substrate.

Then, as illustrated in FIGS. 13 and 17, the manufacturing equipment forms the interlayer insulating film 23 on the gate insulating film 13. The interlayer insulating film 23 is formed using, for example, the CVD method. This process covers the semiconductor film 21 with the interlayer insulating film 23.

The manufacturing equipment then forms the first contact hole H1 and the second contact hole H2 in the interlayer insulating film 23. For example, the manufacturing equipment forms a resist (not illustrated) on the interlayer insulating film 23. The resist is patterned by the photolithography to be formed into a shape that exposes an area in which the first contact hole H1 is to be formed and an area in which the second contact hole H2 is to be formed and that covers the other area. The manufacturing equipment then uses the dry etching technique to remove the interlayer insulating film 23 in the areas exposed from the resist. This process forms the first contact hole H1 and the second contact hole H2 in the interlayer insulating film 23. After forming the first contact hole H1 and the second contact hole H2, the manufacturing equipment removes the resist.

The manufacturing equipment then forms the signal line SGL (including the source 31s illustrated in FIG. 6), the drain 31d, and the second reflective film 31r on the interlayer insulating film 23. For example, the manufacturing equipment forms a titanium film, then an aluminum film, and then another titanium film as a metal film on the interlayer insulating film 23. The metal film is formed using, for example, the sputtering method. The manufacturing equipment then patterns the metal film using the photolithography technique and the dry etching technique. Thus, the manufacturing equipment forms the signal line SGL coupled to the semiconductor film 21 through the first contact hole H1, the drain 31d coupled to the semiconductor film 21 through the second contact hole H2, and the second reflective film 31r formed in island-like shapes in the plan view. The manufacturing equipment then removes the resist.

Figure 14:
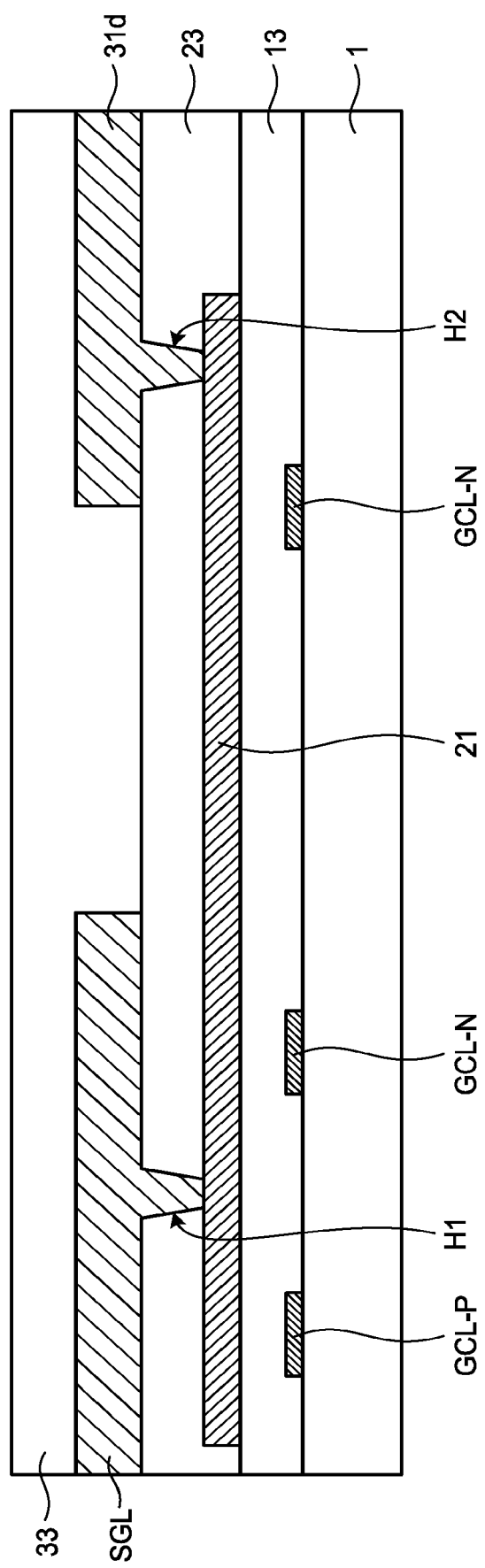
FIG. 14 is still another sectional view for explaining the manufacturing method of the TFT substrate.
Figure 18:
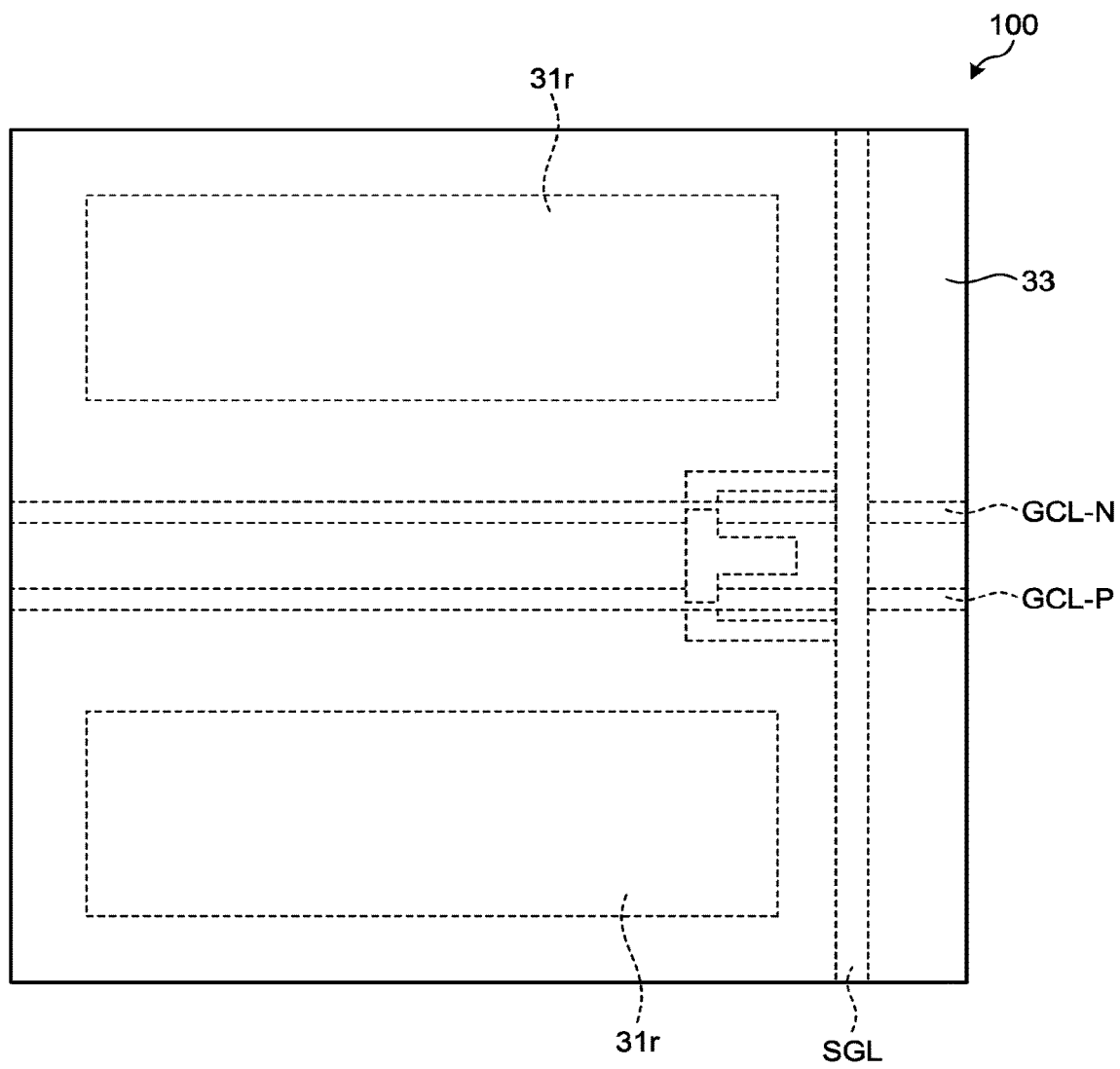
FIG. 18 is still another plan view for explaining the manufacturing method of the TFT substrate.

Then, as illustrated in FIGS. 14 and 18, the manufacturing equipment forms the planarizing film 33 on the interlayer insulating film 23. The planarizing film 33 has an insulating property, and is, for example, an organic material, such as an acrylic resin. The planarizing film 33 is formed using, for example, a slit coat method or a spin coating method. This process covers the signal line SGL, the drain 31d, and the second reflective film 31r with the planarizing film 33. The planarizing film 33 can be increased in film thickness by using the organic material, such as the acrylic resin, for the planarizing film 33. This increase in film thickness can reduce parasitic capacitance between the common electrode 41 and the signal line SGL, and parasitic capacitance between the common electrode 41 and the drain 31d.

Figure 15:
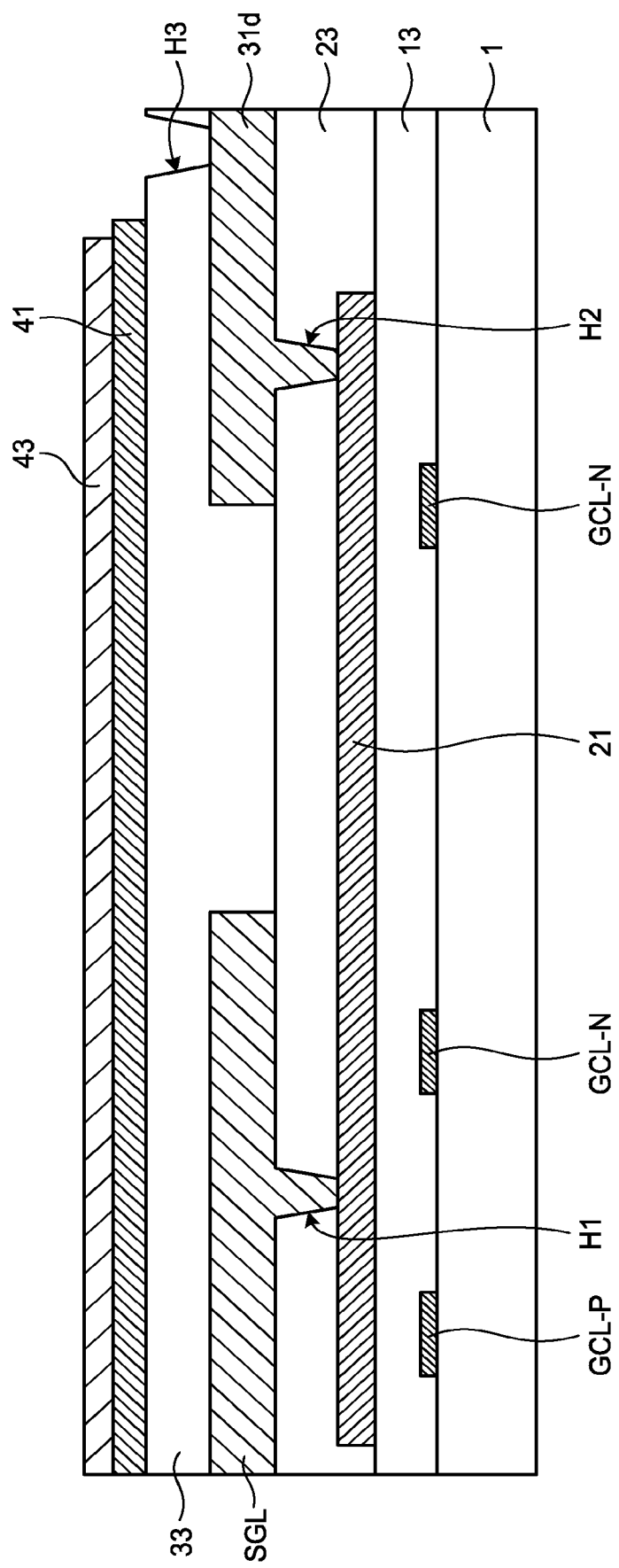
FIG. 15 is still another sectional view for explaining the manufacturing method of the TFT substrate.
Figure 19:
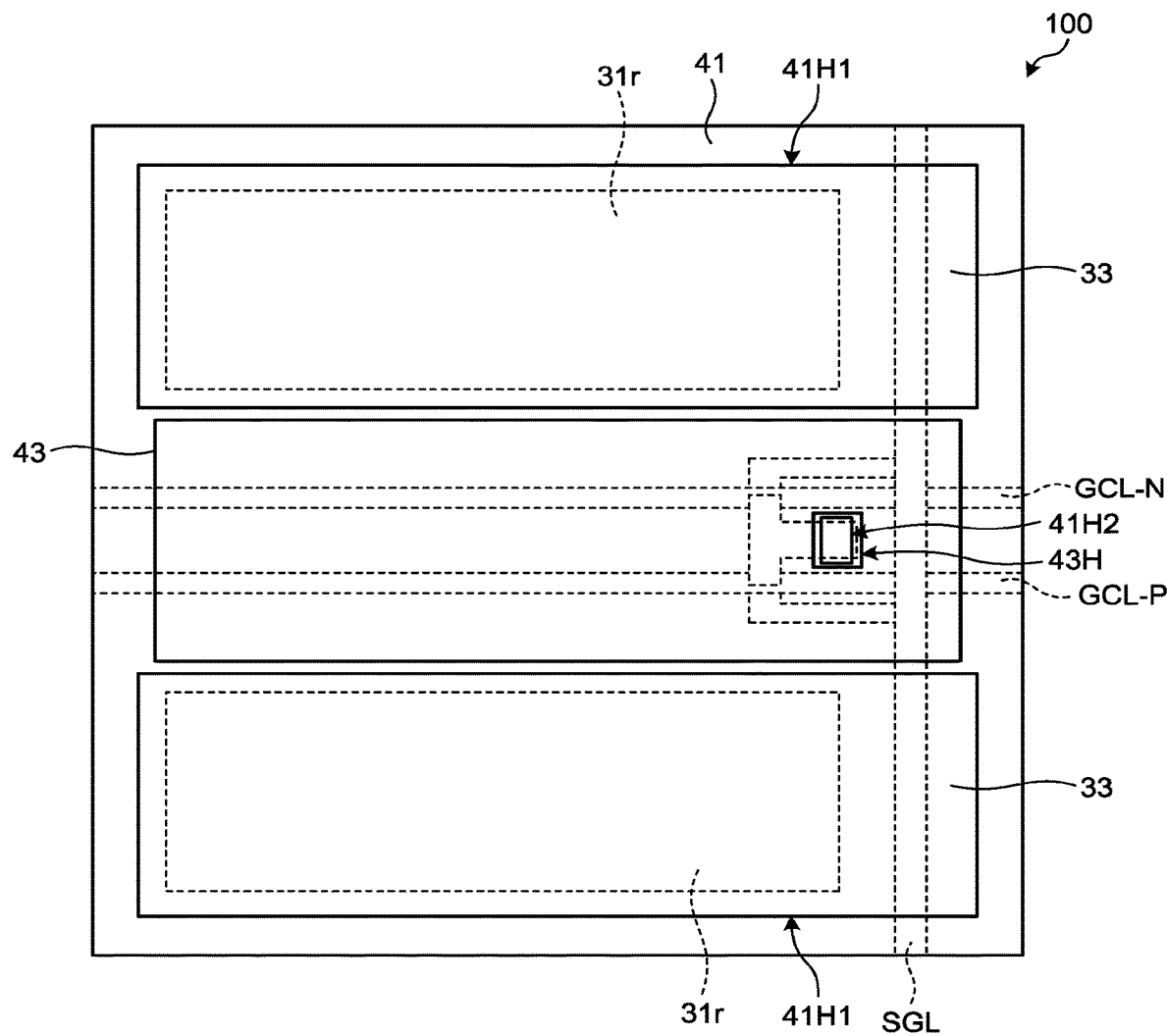
FIG. 19 is still another plan view for explaining the manufacturing method of the TFT substrate.

Then, as illustrated in FIGS. 15 and 19, the manufacturing equipment forms the common electrode 41 and the first reflective film 43 on the planarizing film 33. For example, the manufacturing equipment forms a conductive film of, for example, ITO on the planarizing film 33. The manufacturing equipment then sequentially forms a molybdenum film, an aluminum film, and another molybdenum film as a metal film on the conductive film. The conductive film and the metal film are formed using, for example, the sputtering method. The manufacturing equipment then patterns the metal film using the photolithography technique and the dry etching technique. Thus, the manufacturing equipment forms the first reflective film 43 having the through-hole 43H. The manufacturing equipment then patterns the conductive film using the photolithography technique and the dry etching technique. Thus, the manufacturing equipment forms the common electrode 41 having the through-holes 41H1 and the through-hole 41H2. After forming the common electrode 41, the manufacturing equipment removes the resist.

The manufacturing equipment then forms the third contact hole H3 in the planarizing film 33. For example, the manufacturing equipment forms a resist (not illustrated) on the planarizing film 33. The resist covers the common electrode 41 and the first reflective film 43. The resist is patterned by the photolithography to be formed into a shape that exposes an area in which the third contact hole H3 is to be formed and that covers the other area. The area in which the third contact hole H3 is to be formed is located inside the through-hole 43H and inside the through-hole 41H2 in the plan view. The manufacturing equipment then uses the dry etching technique to remove the planarizing film 33 in the area exposed from the resist. This process forms the third contact hole H3 in the planarizing film 33. After forming the third contact hole H3, the manufacturing equipment removes the resist.

The manufacturing equipment then forms the insulating film 45 (refer to FIG. 11) above the base material 1. The insulating film 45 is formed using, for example, the CVD method. This process covers the common electrode 41 and the first reflective film 43 with the insulating film 45. This process also covers the internal surface and the bottom of the third contact hole H3 with the insulating film 45. The manufacturing equipment then removes a portion of the insulating film 45 covering the bottom of the third contact hole H3. For example, the manufacturing equipment forms a resist (not illustrated) on the insulating film 45. The resist is patterned by the photolithography to be formed into a shape that exposes an area overlapping the bottom of the third contact hole H3 in the plan view and that covers the other area. The manufacturing equipment then uses the dry etching technique to remove the insulating film 45 in the area exposed from the resist. This process exposes the bottom of the third contact hole H3 from the insulating film 45. The manufacturing equipment then removes the resist.

The manufacturing equipment then forms the pixel electrode 51 (refer to FIG. 11) on the insulating film 45. For example, the manufacturing equipment forms a conductive film of, for example, ITO on the insulating film 45. The conductive film is formed using, for example, the sputtering method. The manufacturing equipment then patterns the conductive film using the photolithography technique and the dry etching technique. Thus, the manufacturing equipment forms the pixel electrode 51 coupled to the drain 31*d* through the third contact hole H3. After forming the pixel electrode 51, the manufacturing equipment removes the resist. The TFT substrate 100 according to the first embodiment is completed through the processes described above.

The following describes the structure of the display device 200 according to the first embodiment. FIG. 20 is a sectional view illustrating a configuration example of the display device 200 according to the first embodiment. As illustrated in FIG. 20, the display device 200 according to the first embodiment includes the above-described TFT substrate 100, the counter substrate 130 disposed so as to be opposed to the TFT substrate 100, the electrophoretic layer 160 disposed between the TFT substrate 100 and the counter substrate 130, and a seal portion 152.

The counter substrate 130 includes a base material 131 and the counter electrode 133. The base material 131 is a light-transmitting glass substrate, a light-transmitting resin substrate, or a light-transmitting resin film. The counter electrode 133 is provided on a surface of the base material 131 opposed to the TFT substrate 100. The counter electrode 133 is made of ITO to serve as a light-transmitting conductive film. The counter electrode 133 is opposed to the pixel electrode 51 with the electrophoretic layer 160 interposed therebetween.

The seal portion 152 is provided between the TFT substrate 100 and the counter substrate 130. The electrophoretic layer 160 is sealed in an internal space surrounded by the TFT substrate 100, the counter substrate 130, and the seal portion 152. The seal portion 152 is provided with a coupling member 153. The counter electrode 133 is coupled to the common electrode 41 of the TFT substrate 100 through the coupling member 153. With this configuration, the common potential VCOM is supplied to the counter electrode 133.

The electrophoretic layer 160 includes a plurality of microcapsules 163. A plurality of black fine particles 161, a plurality of white fine particles 162, and a dispersion liquid 165 are encapsulated in each of the microcapsules 163. The black fine particles 161 and the white fine particles 162 are dispersed in the dispersion liquid 165. The dispersion liquid 165 is a light-transmitting liquid, such as silicone oil. The black fine particles 161 are electrophoretic particles, and are made using, for example, negatively charged graphite. The white fine particles 162 are electrophoretic particles, and are made using, for example, a positively charged titanium oxide ($TiO_2$).

The dispersion states of the black fine particles 161 and the white fine particles 162 are changed by an electric field generated between the pixel electrode 51 and the counter electrode 133. The transmission state of light transmitted through the electrophoretic layer 160 changes with the dispersion states of the black fine particles 161 and the white fine particles 162. Thus, an image is displayed on a display surface. For example, when the common potential VCOM (of 0 V, for example) is supplied to the counter electrode 133 and a negative potential is supplied to the pixel electrode 51, the negatively charged black fine particles 161 move toward the counter substrate 130, and the positively charged white fine particles 162 move toward the TFT substrate 100. As a result, when the TFT substrate 100 is viewed from the counter substrate 130 side, an area (pixel) overlapping the pixel electrode 51 in the plan view is displayed in black.

As described above, the TFT substrate 100 according to the first embodiment includes the base material 1, the pixel electrode 51 provided on one surface side of the base material 1, the pixel transistor TR provided between the pixel electrode 51 and the base material 1, and the first reflective film 43 provided between the pixel transistor TR and the pixel electrode 51. The first reflective film 43 has the through-hole 43H. The drain 31*d* of the pixel transistor TR is coupled to the pixel electrode 51 through the through-hole 43H.

With this configuration, the drain 31*d* located below the first reflective film 43 can be coupled to the pixel electrode 51 located above the first reflective film 43. The first reflective film 43 can reflect, toward the pixel electrode 51, light transmitted through the counter substrate 130 and the electrophoretic layer 160 and incident from the pixel electrode 51 side (hereinafter called incident light). As a result, the display device 200 including the TFT substrate 100 can increase brightness of display.

For example, under an outdoor environment where intense light is being radiated, the light incident on the display surface of the EPD may transmit the electrophoretic layer to reach the pixel transistor. Intense light entering the pixel transistor generates a photo leakage current due to a photoconductivity effect, and may cause a malfunction of the pixel transistor. As a result, reliability of the EPD may degrade.

However, in the TFT substrate 100 according to the first embodiment, since the pixel transistor TR is shielded from the light by the first reflective film 43, the generation of the photo leakage current by the photoconductivity effect (hereinafter called photoelectric conversion) in the pixel transistor TR is reduced. This reduction of the photo leakage current allows the TFT substrate 100 to reduce the possible malfunction of the pixel transistor TR. As a result, the present embodiment can provide the TFT substrate 100 capable of improving the reliability.

The TFT substrate 100 further includes the common electrode 41 provided between the pixel transistor TR and the first reflective film 43. The common electrode 41 has the through-hole 41H2. The drain 31*d* is coupled to the pixel electrode 51 through the through-hole 41H2 of the common electrode 41 and the through-hole 43H of the first reflective film 43. With this configuration, the drain 31*d* located below the common electrode 41 can be coupled to the pixel electrode 51 located above the common electrode 41. The first reflective film 43 is provided on the common electrode 41. With this configuration, the first reflective film 43 can be improved in closeness of contact to the underlayer thereof.

The TFT substrate 100 further includes the second reflective film 31*r* provided between the pixel electrode 51 and the base material 1. The common electrode 41 has the through-holes 41H1 provided at locations different from that of the through-hole 41H2. The second reflective film 31*r* is disposed at locations overlapping the through-holes 41H1 in the plan view. With this configuration, the capacitance value of the first retention capacitance C1 generated between the pixel electrode 51 and the common electrode 41 can be made closer to a desired value by changing the design value of the opening area of the through-holes 41H1.

The second reflective film 31*r* can reflect, toward the pixel electrode 51, a portion of the incident light incident from the pixel electrode 51 side that has passed through the through-holes 41H1. As a result, the display device 200 including the TFT substrate 100 can further increase the brightness of display. The pixel transistor TR is shielded from the light passing through the through-holes 41H1 by the second reflective film 31r. Since this shielding further restrains the photoelectric conversion in the pixel transistor TR, the TFT substrate 100 can further reduce the possible malfunction of the pixel transistor TR. As a result, the present embodiment can provide the TFT substrate 100 that can further improve the reliability.

The first reflective film 43 and the second reflective film 31r are adjacently disposed in the plan view. This configuration can reduce the size of gaps between the first reflective film 43 and the second reflective film 31r, and can increase the area of the reflective films for reflecting the incident light. As a result, the TFT substrate 100 can efficiently reflect the incident light toward the pixel electrode 51.

The second reflective film 31r is provided in the same layer as that of the source 31s and the drain 31d. The second reflective film 31r is made of a material having the same composition as that of the material of the source and the drain. This configuration allows the second reflective film 31r to be simultaneously formed in the same process as that of the source 31s and the drain 31d. As a result, the number of manufacturing processes of the TFT substrate 100 can be restrained from increasing.

Portions of the drain 31d of the pixel transistor TR are disposed at locations overlapping the gates of the pixel transistor TR in the plan view. For example, the first end portion 311A of the drain 31d is disposed at a location overlapping a portion of the gate n2g of the second NMOS transistor ntr2 included in the pixel transistor TR in the plan view. The second end portion 311B of the drain 31d is disposed at a location overlapping a portion of the gate p2g of the second PMOS transistor ptr2 included in the pixel transistor TR in the plan view. With this configuration, when a portion of the incident light (such as light obliquely incident on the surface 1a of the base material 1) is incident on the pixel transistor TR side through the through-holes 41H1, this light is blocked by the drain 31d. Thus, since the light is restrained from entering the gates n2g and p2g, the photoelectric conversion is further restrained.

The TFT substrate 100 further includes the semiconductor film 21 that is provided between the base material 1 and the first reflective film 43, and is coupled to the source 31s and the drain 31d. The shape in the plan view of the semiconductor film 21 is a ring shape. This shape allows each of the gate lines GCL extending in one direction to intersect the semiconductor film 21 at two places thereof in the plan view. As a result, the TFT substrate 100 can include MOS transistors coupled in series as a pixel transistor. For example, in each of the pixels PX, the first gate line GCL-N intersects the semiconductor film 21 at two places thereof. As a result, the pixel transistor TR can include the first NMOS transistor ntr1 and the second NMOS transistor ntr2 coupled in series. In each of the pixels PX, the second gate line GCL-P also intersects the semiconductor film 21 at two places thereof. As a result, the pixel transistor TR can include the first PMOS transistor ptr1 and the second PMOS transistor ptr2 coupled in series.

The pixel transistor TR includes the NMOS transistor NTR and the PMOS transistor PTR coupled in parallel to the NMOS transistor NTR. With this configuration, the pixel transistor TR can have the complementary MOS (CMOS) configuration. The voltage amplitude applied to each of the NMOS transistor NTR and the PMOS transistor PTR can be made smaller, and withstand voltages of the PMOS transistor PTR and the NMOS transistor NTR constituting the pixel transistor TR can be set lower than in a case where the pixel transistor does not have the CMOS configuration.

The TFT substrate 100 according to the first embodiment also includes the first gate line GCL-N provided on the surface 1a side of the base material 1, the second gate line GCL-P that is provided on the surface 1a side of the base material 1 and is parallel to the first gate line, and the signal line SGL that is provided on the surface 1a side of the base material 1 and intersects the first gate line GCL-N and the second gate line GCL-P in the plan view. The signal line SGL is disposed at a location overlapping the pixel transistor TR in the plan view. For example, the signal line SGL overlaps the first NMOS transistor ntr1 in the plan view, and also overlaps the first PMOS transistor ptr1 in the plan view. With this configuration, when a portion of the incident light (such as light obliquely incident on the surface 1a of the base material 1) is incident on the pixel transistor TR side through the through-holes 41H1, this light is blocked by the signal line SGL. Thus, since the light is restrained from entering the gates of the pixel transistor TR, the photoelectric conversion is further restrained.

The display device 200 according to the first embodiment includes the above-described TFT substrate 100 and the display layer disposed so as to be opposed to the TFT substrate 100. The display layer is, for example, the electrophoretic layer 160. As a result, the present embodiment can provide an electrophoretic device capable of improving the reliability as the display device 200.

Modifications

In the above-described first embodiment, the description has been made that each of the NMOS transistor NTR and the PMOS transistor PTR included in the pixel transistor TR is the bottom-gate transistor. In the present embodiment, however, each of the NMOS transistor NTR and the PMOS transistor PTR is not limited to the bottom-gate transistor. In the present embodiment, each of the NMOS transistor NTR and the PMOS transistor PTR may be a top-gate transistor.

Figure 21:
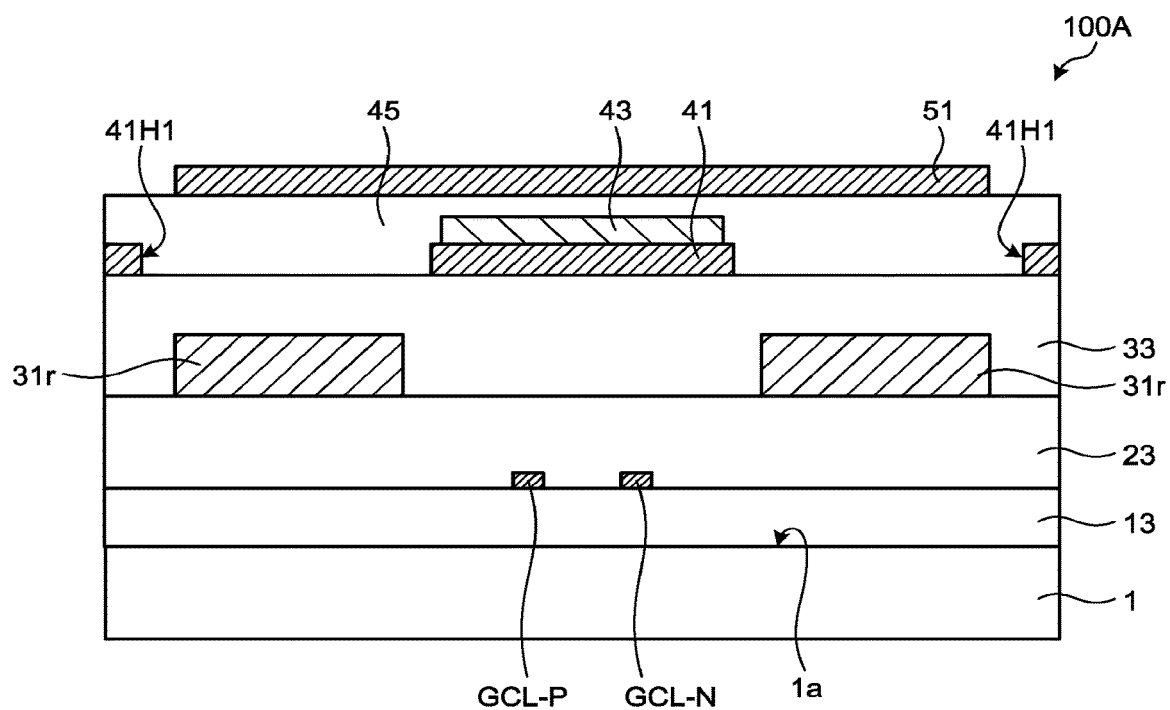
FIG. 21 is a sectional view illustrating a TFT substrate according to a first modification of the first embodiment.
Figure 22:
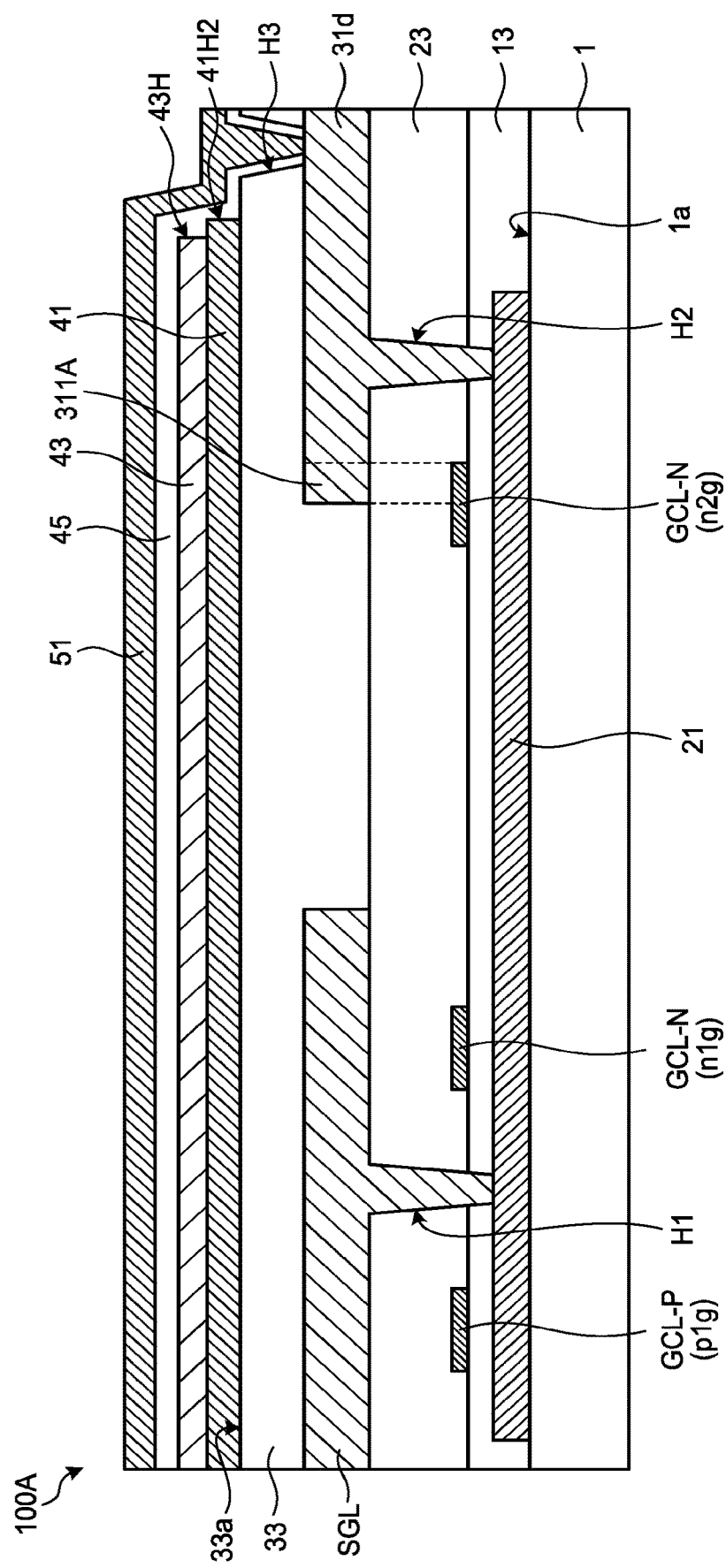
FIG. 22 is another sectional view illustrating the TFT substrate according to the first modification of the first embodiment.

FIGS. 21 and 22 are sectional views illustrating a TFT substrate according to a first modification of the first embodiment. FIG. 21 illustrates a section obtained by cutting a TFT substrate 100A according to the first modification of the first embodiment in the same position as that of line X-X' (refer to FIG. 4). FIG. 22 illustrates a section obtained by cutting the TFT substrate 100A according to the first modification of the first embodiment in the same position as that of line XI-XI' (refer to FIG. 5).

In the TFT substrate 100A according to the first modification, each of the NMOS transistor NTR and the PMOS transistor PTR is the top-gate transistor. For example, as illustrated in FIGS. 21 and 22, in the TFT substrate 100A, the semiconductor film 21 is provided on the surface 1a of the base material 1. The gate insulating film 13 is also provided on the surface 1a of the base material 1. The gate insulating film 13 covers the semiconductor film 21. The first gate line GCL-N and the second gate line GCL-P are provided on the gate insulating film 13. Such a configuration also provides the same effects as those of the above-described first embodiment.

Figure 23:
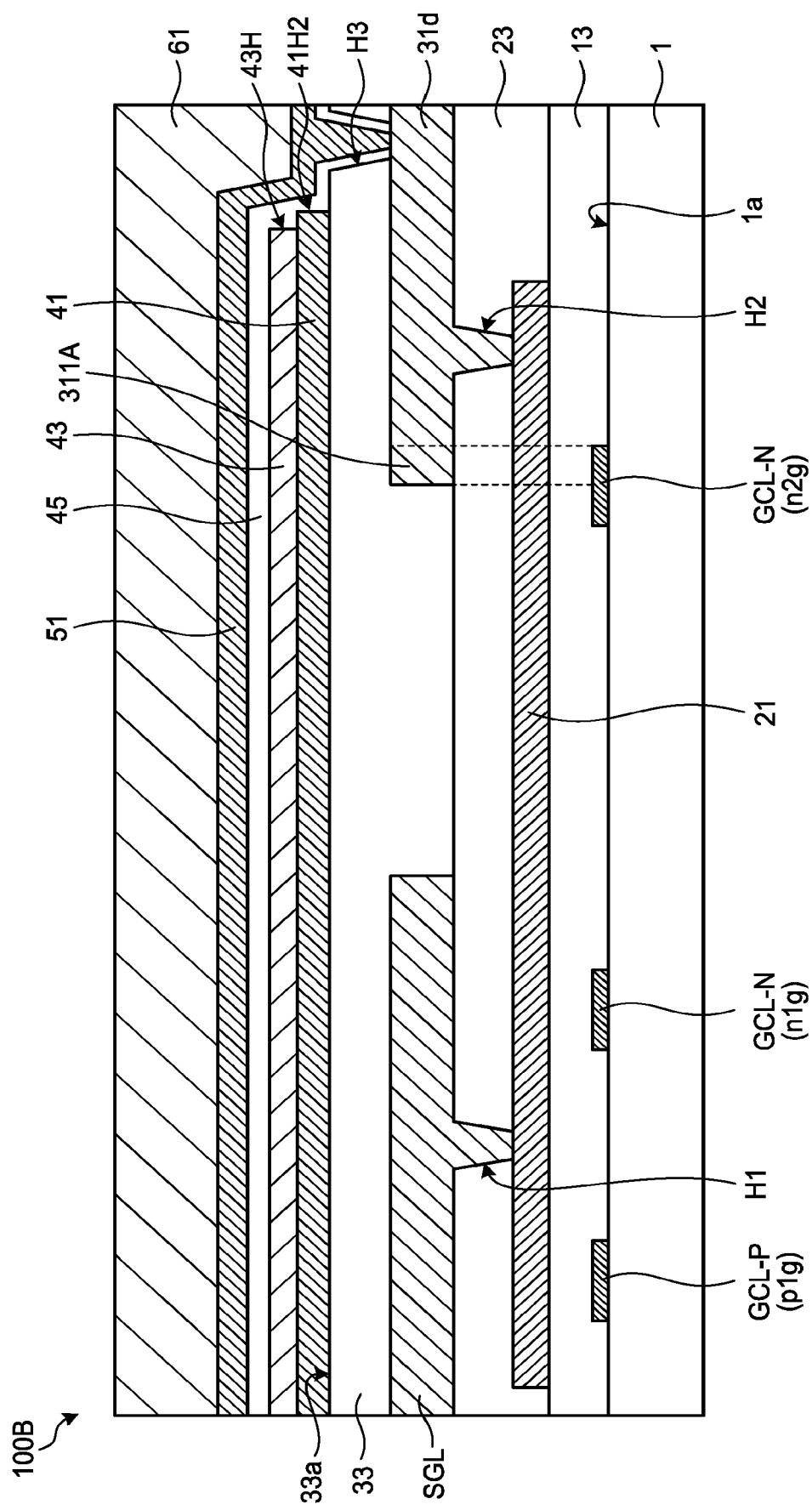
FIG. 23 is a sectional view illustrating a TFT substrate according to a second modification of the first embodiment.

The TFT substrate according to the present embodiment may include a protective film for protecting the pixel electrode 51. FIG. 23 is a sectional view illustrating a TFT substrate according to a second modification of the first embodiment. FIG. 23 illustrates a section obtained by cutting a TFT substrate 100B according to the second modification of the first embodiment in the same position as that of line XI-XI' (refer to FIG. 5). As illustrated in FIG. 23, the TFT substrate 100B includes a protective film 61 provided on the pixel electrode 51. The protective film 61 is, for example, a resist. With such a configuration, the pixel electrode 51 is covered and protected by the protective film 61. As a result, if a situation occurs where an external object comes into contact with the TFT substrate 100B while the TFT substrate 100B is carried, the external object can be prevented from coming into direct contact with the pixel electrode 51. Accordingly, the pixel electrode 51 can be prevented from being damaged.

In the first embodiment, the description has been made that the shape in the plan view of the semiconductor film 21 is the rectangular ring shape. In the present embodiment, however, the ring shape of the semiconductor film 21 is not limited to the rectangle. The shape in the plan view of the semiconductor film 21 may be a circular ring shape. Also with such a configuration, the TFT substrate 100 provides the same effects as those in the case where the ring shape of the semiconductor film 21 is rectangular.

In the first embodiment, the description has been made that the common electrode 41 is constituted by the light-transmitting conductive film. In the present embodiment, however, the common electrode 41 may be made of a metal, such as aluminum, instead of being constituted by the light-transmitting conductive film. In this case, the first reflective film 43 may be omitted. If the common electrode 41 is made of the metal, the common electrode 41 can reflect the incident light toward the pixel electrode 51 side.

In the first embodiment, the description has been made that the display layer opposed to the TFT substrate 100 is the electrophoretic layer 160. In the present embodiment, however, the display layer is not limited to the electrophoretic layer 160. The display layer may be, for example, a liquid crystal layer. As a result, a liquid crystal display device with reliability improved can be provided.

In the present embodiment, an optical sheet (not illustrated) may be provided on the pixel electrode 51. For example, if the display layer is the liquid crystal layer, an orientation film may be provided as the optical sheet between the pixel electrode 51 and the liquid crystal layer. This configuration can align liquid crystal molecules included in the liquid crystal layer in a certain direction.

Second Embodiment

In the above-described first embodiment, the description has been made that the pixel transistor TR has the complementary MOS (CMOS) configuration, and includes both the NMOS transistor NTR and the PMOS transistor PTR. In the present embodiment, however, the pixel transistor TR is not limited to the complementary MOS (CMOS) configuration. The pixel transistor TR may have a configuration including only either one of the NMOS transistor NTR and the PMOS transistor PTR.

Figure 24:
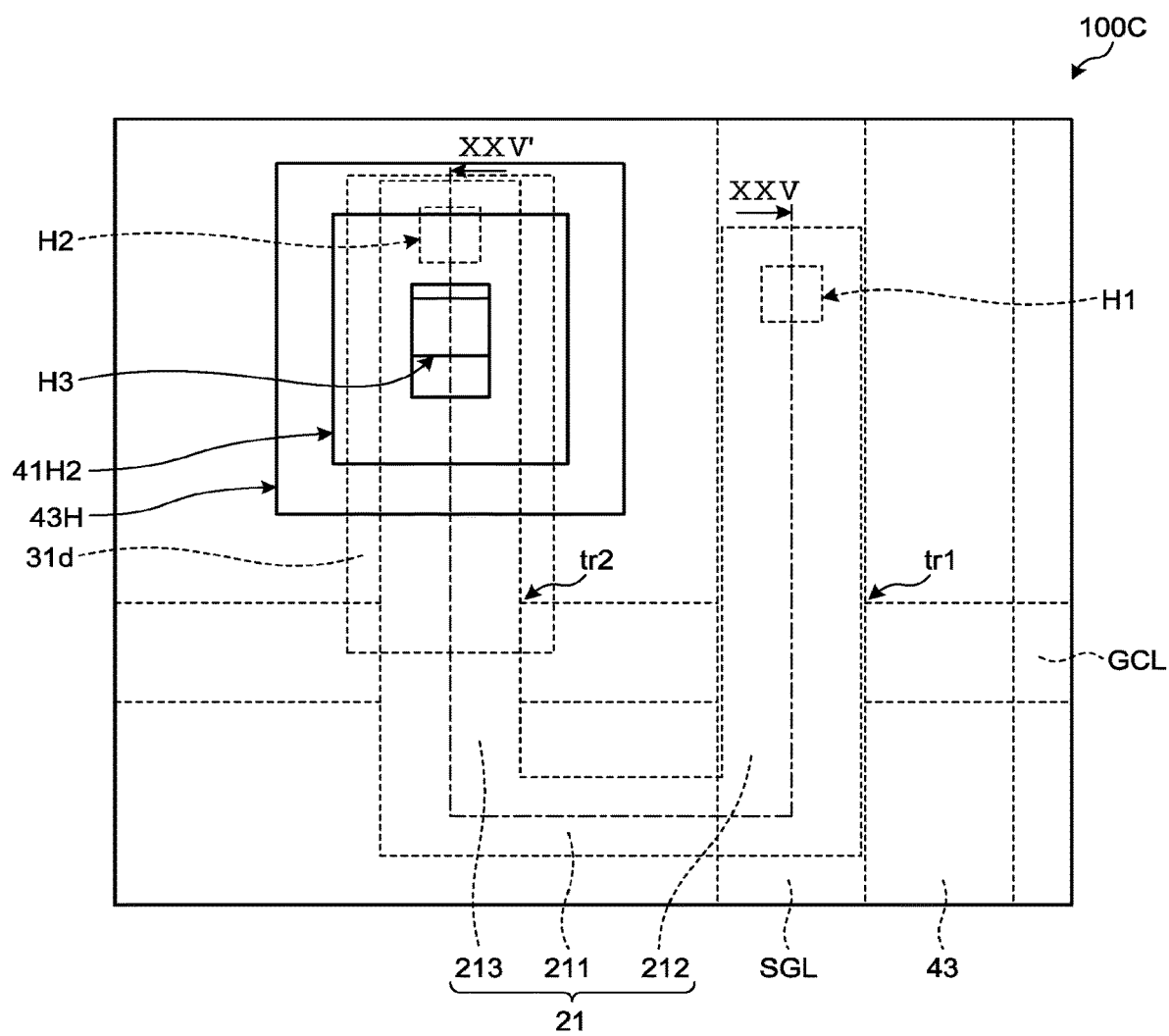
FIG. 24 is a plan view illustrating a configuration example of a TFT substrate according to a second embodiment of the present disclosure.
Figure 25:
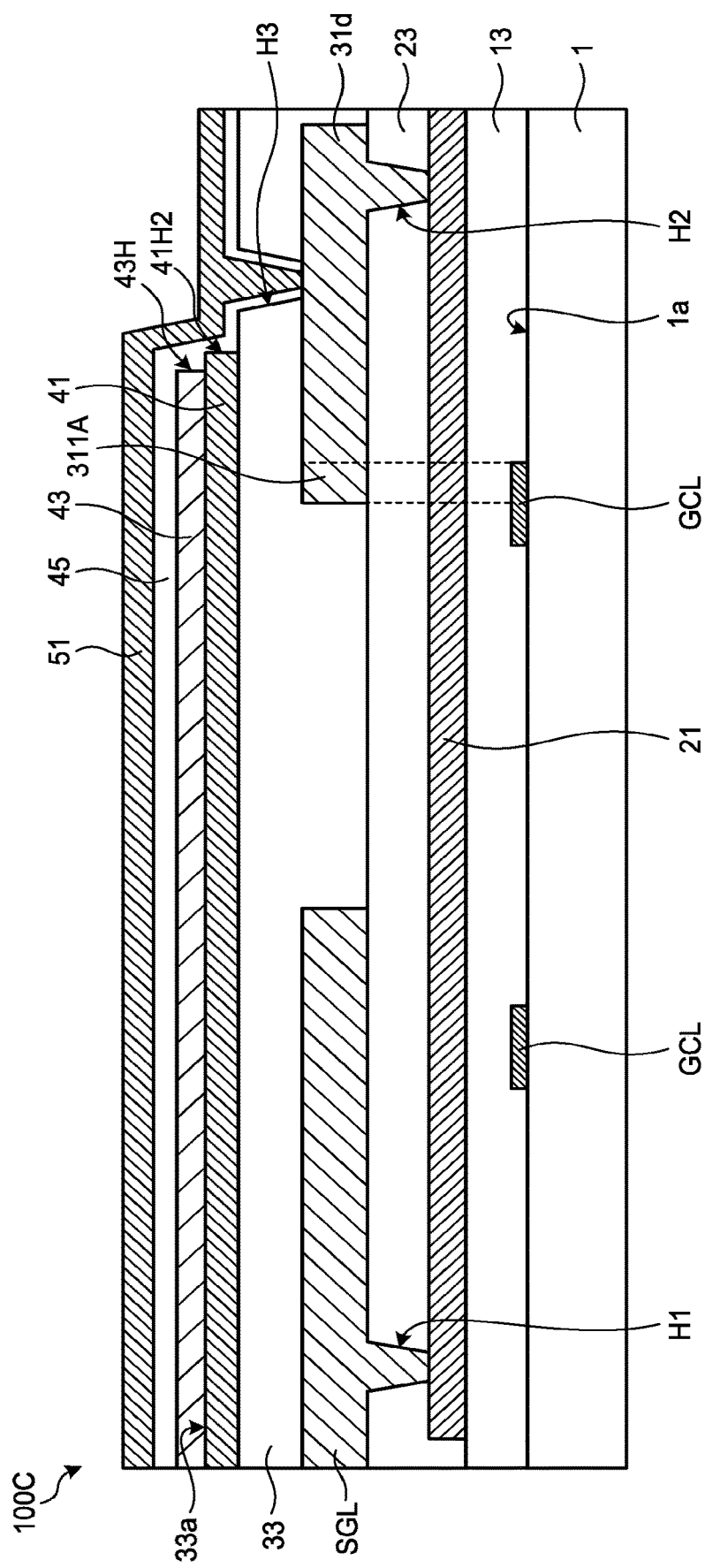
FIG. 25 is a sectional view obtained by cutting the plan view illustrated in FIG. 24 along line XXV-XXV'.

FIG. 24 is a plan view illustrating a configuration example of a TFT substrate according to a second embodiment of the present disclosure. FIG. 25 is a sectional view obtained by cutting the plan view illustrated in FIG. 24 along line XXV-XXV'. In a TFT substrate 100C according to the second embodiment, the pixel transistor TR is an NMOS transistor or a PMOS transistor. In the TFT substrate 100C, one gate line GCL is coupled to one pixel.

As illustrated in FIG. 24, the shape in the plan view of the semiconductor film 21 is, for example, a U-shape. That is, the semiconductor film 21 includes a linear first portion 211, a linear second portion 212, and a linear third portion 213. The second portion 212 is coupled to one end of the first portion 211, and the third portion 213 is coupled to the other end of the first portion 211. The first portion 211 and the second portion 212 form an angle of substantially 90 degrees. The first portion 211 and the third portion 213 also form an angle of substantially 90 degrees.

As illustrated in FIGS. 24 and 25, the pixel transistor TR includes a first MOS transistor tr1 and a second MOS transistor tr2. A portion of the gate line GCL intersecting the third portion 213 of the semiconductor film 21 serves as the gate of the first MOS transistor tr1. A portion of the gate line GCL intersecting the second portion 212 of the semiconductor film 21 serves as the gate of the second MOS transistor tr2. The first MOS transistor tr1 is coupled in series to the second MOS transistor tr2.

In the same manner as the TFT substrate 100 according to the first embodiment, the TFT substrate 100C according to the second embodiment includes the base material 1, the pixel electrode 51 provided on the surface 1a side of the base material 1, the pixel transistor TR provided between the pixel electrode 51 and the base material 1, and the first reflective film 43 provided between the pixel transistor TR and the pixel electrode 51. The first reflective film 43 has the through-hole 43H. The drain 31d of the pixel transistor TR is coupled to the pixel electrode 51 through the through-hole 43H.

This configuration allows the first reflective film 43 to reflect the light incident from the pixel electrode 51 side toward the pixel electrode 51. As a result, the display device including the TFT substrate 100C can increase the brightness of display. Since the pixel transistor TR is shielded from the light by the first reflective film 43, the photoelectric conversion is restrained in the pixel transistor TR. As a result, the TFT substrate 100C can reduce the possible malfunction of the pixel transistor TR. Thus, the present embodiment can provide the TFT substrate 100C capable of improving the reliability.

The TFT substrate 100C according to the second embodiment includes the semiconductor film 21 having the U-shape in the plan view. In each of the pixels PX, one gate line GCL intersects the semiconductor film 21 at two places thereof. As a result, the TFT substrate 100C can include the two MOS transistors tr1 and tr2 coupled in series as the pixel transistor TR.

Third Embodiment

Figure 26:
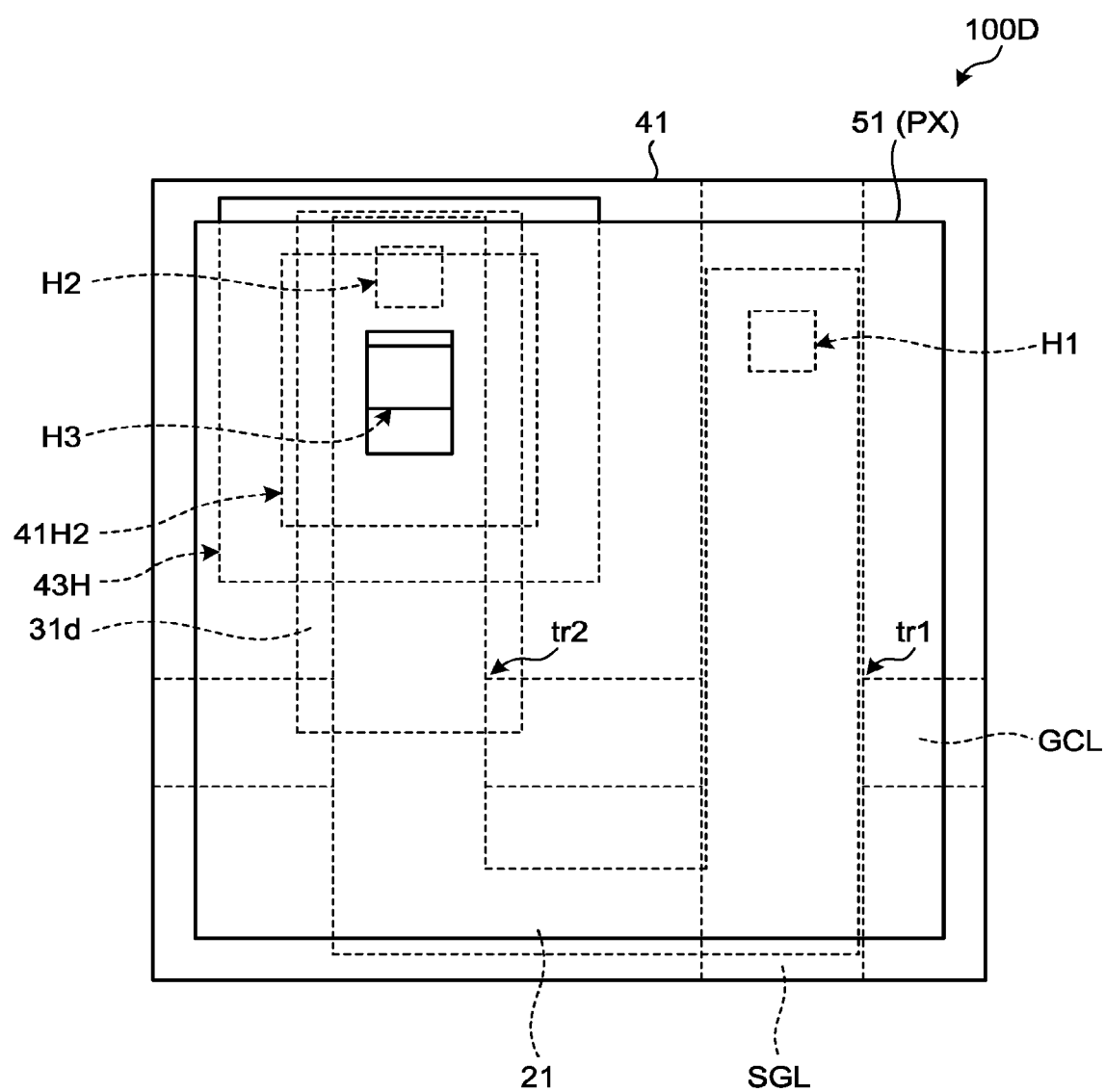
FIG. 26 is a plan view illustrating a configuration example of a TFT substrate according to a third embodiment of the present disclosure.
Figure 27:
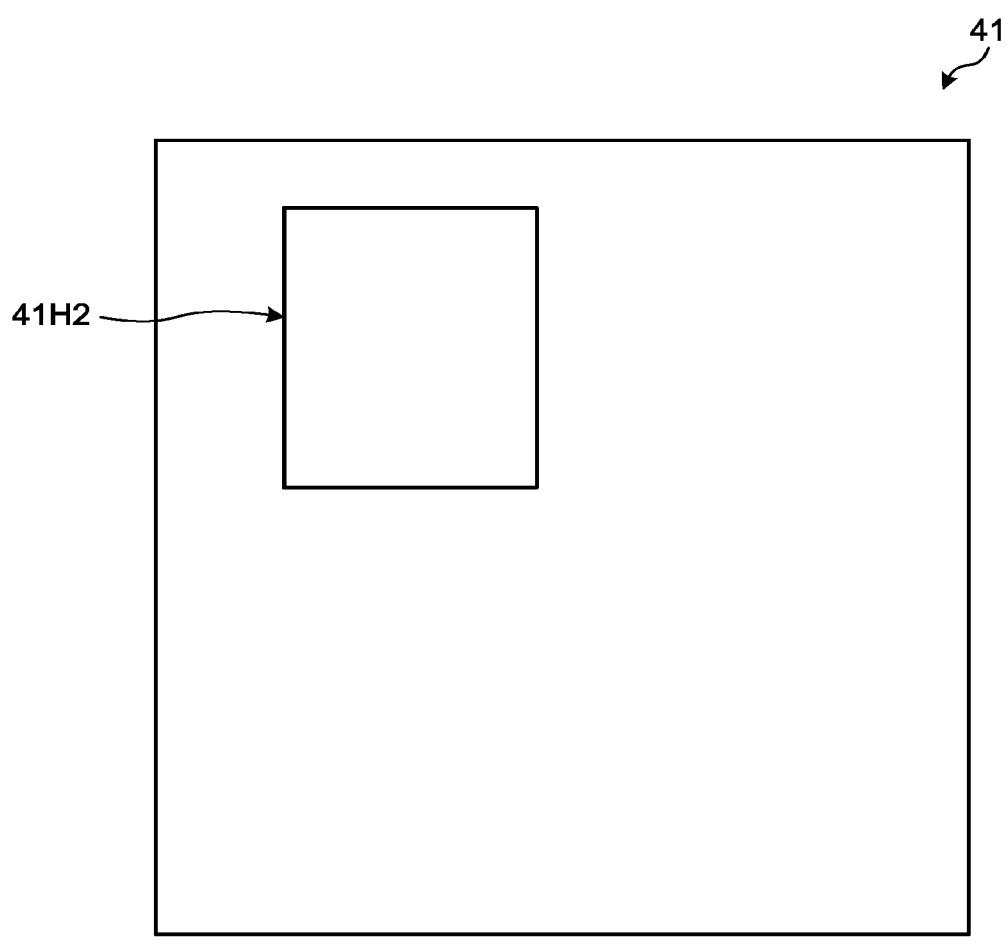
FIG. 27 is a plan view illustrating a configuration example of the common electrode according to the third embodiment.

FIG. 26 is a plan view illustrating a configuration example of a TFT substrate according to a third embodiment of the present disclosure. FIG. 27 is a plan view illustrating a configuration example of the common electrode according to the third embodiment. As illustrated in FIG. 26, a TFT substrate 100D according to the third embodiment includes the semiconductor film 21 having the U-shape in the plan view. The TFT substrate 100D has a higher definition and is smaller in pixel size (that is, in area of the pixel electrode 51) than the TFT substrate 100C according to the second embodiment. For example, the area of a portion of the semiconductor film 21 overlapping the pixel electrode 51 in the plan view is substantially half the area of the pixel electrode 51. In this manner, the area of the portion of the semiconductor film 21 overlapping the pixel electrode 51 in the plan view is set to 50% or more and 60% or less of the area of the pixel electrode 51, and as a result, the TFT substrate 100D is made higher in definition than the TFT substrate 100C according to the second embodiment.

Also in the TFT substrate 100D according to the third embodiment, one gate line GCL in each of the pixels PX intersects the semiconductor film 21 at two places thereof in the same manner as in the case of the TFT substrate 100C according to the second embodiment. As a result, the TFT substrate 100D can include the two MOS transistors tr1 and tr2 coupled in series as the pixel transistor TR.

As illustrated in FIG. 27, the common electrode 41 included in the TFT substrate 100D is not provided with the through-holes 41H1 (refer to FIG. 8). The through-hole 41H2 for coupling the pixel electrode 51 to the drain 31d is only one through-hole provided in the common electrode 41. This configuration ensures capacitance values of the first retention capacitance C1 and the second retention capacitance C2 (refer to FIG. 2) in each of the pixels PX while increasing the definition of the TFT substrate 100D.

The preferred embodiments of the present disclosure have been described above. The present disclosure is, however, not limited to the embodiments described above. The contents disclosed in the embodiments are merely examples, and can be variously modified within the scope not departing from the gist of the present disclosure. Any modifications appropriately made within the scope not departing from the gist of the present disclosure also naturally belong to the technical scope of the present disclosure.

What is claimed is:

1. A substrate comprising:
    a base material having an insulating property;
    a pixel electrode provided on one surface side of the base material;
    a pixel transistor provided between the base material and the pixel electrode;
    a first reflective film provided between the pixel transistor and the pixel electrode; and
    a common electrode provided between the pixel transistor and the first reflective film, wherein
    the first reflective film has a first through-hole,
    the common electrode has a second through-hole,
    a drain of the pixel transistor is coupled to the pixel electrode through the first through-hole and the second through-hole, and
    the pixel transistor comprises:
        an n-channel metal-oxide semiconductor (NMOS) transistor; and
        a p-channel metal-oxide semiconductor (PMOS) transistor coupled in parallel to the NMOS transistor.

2. The substrate according to claim 1, wherein the first reflective film is provided on the common electrode.

3. The substrate according to claim 2, further comprising a second reflective film provided between the pixel electrode and the base material, wherein
    the common electrode has a third through-hole provided at a location different from that of the second through-hole, and
    the second reflective film is disposed at a location overlapping the third through-hole in a plan view.

4. The substrate according to claim 3, wherein the first reflective film and the second reflective film are adjacently disposed in the plan view.

5. The substrate according to claim 1, wherein a portion of the drain is disposed at a location overlapping a gate of the pixel transistor in the plan view.

6. The substrate according to claim 1, further comprising a semiconductor film that is provided between the base material and the first reflective film and that is coupled to a source and the drain of the pixel transistor, wherein
    the semiconductor film has a ring shape in the plan view.

7. The substrate according to claim 1, wherein the NMOS transistor comprises a first NMOS transistor and a second NMOS transistor coupled in series to the first NMOS transistor.

8. The substrate according to claim 1, wherein the PMOS transistor comprises a first PMOS transistor and a second PMOS transistor coupled in series to the first PMOS transistor.

9. The substrate according to claim 1, further comprising a semiconductor film that is provided between the base material and the first reflective film and that is coupled to a source and the drain of the pixel transistor, wherein
    the semiconductor film has a U-shape in the plan view.

10. The substrate according to claim 1, further comprising:
    a first gate line provided on the one surface side of the base material;
    a second gate line that is provided on the one surface side of the base material and is parallel to the first gate line; and
    a signal line that is provided on the one surface side of the base material and intersects the first gate line and the second gate line in the plan view, wherein
    the signal line is disposed at a location overlapping the pixel transistor in the plan view.

11. A substrate comprising:
    a base material having an insulating property;
    a pixel electrode provided on one surface side of the base material;
    a pixel transistor provided between the base material and the pixel electrode;
    a first reflective film provided between the pixel transistor and the pixel electrode, the first reflective film having a first through-hole;
    a common electrode provided between the pixel transistor and the first reflective film, the common electrode having
        a second through-hole and
        a third through-hole provided at a location different from that of the second through-hole; and
    a second reflective film provided between the pixel electrode and the base material, at a location overlapping the third through-hole in a plan view,
    wherein
    the first reflective film is provided on the common electrode,
    a drain of the pixel transistor is coupled to the pixel electrode through
        the first through-hole and
        the second trough-hole,
    the first reflective film and the second reflective film are adjacently disposed in the plan view, and
    the second reflective film is provided in the same layer as that of a source and the drain of the pixel transistor.

12. The substrate according to claim 11, wherein the second reflective film is made of a material having the same composition as that of a material of the source and the drain of the pixel transistor.

* * * * *